United States Patent
McLaughlin

(10) Patent No.: US 6,947,606 B2
(45) Date of Patent: Sep. 20, 2005

(54) SKIM ENCODING METHOD FOR COMPRESSION OF A TWO DIMENSIONAL ARRAY OF DATA

(75) Inventor: John McLaughlin, Los Angeles, CA (US)

(73) Assignees: Sony Corporation, Tokyo (JP); Sony Pictures Entertainment, Inc., Culver City, CA (US)

( * ) Notice: Subject to any disclaimer, the term of this patent is extended or adjusted under 35 U.S.C. 154(b) by 565 days.

(21) Appl. No.: 10/224,270

(22) Filed: Aug. 19, 2002

(65) Prior Publication Data

US 2003/0113029 A1 Jun. 19, 2003

Related U.S. Application Data

(60) Provisional application No. 60/313,862, filed on Aug. 21, 2001.

(51) Int. Cl.[7] .................................................. G06K 9/36
(52) U.S. Cl. .................................................... 382/246
(58) Field of Search ................................ 382/173, 232, 382/236, 246; 341/59, 65; 707/4, 101; 715/531; 345/589

(56) References Cited

U.S. PATENT DOCUMENTS

| | | | | |
|---|---|---|---|---|
| 5,883,633 A | * | 3/1999 | Gill et al. ................... | 345/589 |
| 6,205,251 B1 | * | 3/2001 | Hsieh et al. ................ | 382/233 |
| 6,259,810 B1 | * | 7/2001 | Gill et al. ................... | 382/166 |
| 6,470,347 B1 | * | 10/2002 | Gillam ....................... | 707/101 |
| 6,671,856 B1 | * | 12/2003 | Gillam ....................... | 715/531 |
| 6,826,563 B1 | * | 11/2004 | Chong et al. ................ | 707/4 |

* cited by examiner

Primary Examiner—Andrew W. Johns
Assistant Examiner—Amir Alavi
(74) Attorney, Agent, or Firm—Foley & Lardner LLP

(57) ABSTRACT

A process for compressing a two dimensional array of data including at least one array block having a plurality of block rows and a plurality of block columns of pixels, each pixel having at least one associated intensity value. The process includes generating a delta frame associated with a pair of the block columns, the delta frame having a plurality of delta rows and delta columns of delta bits, one of the delta rows being a highest order row; determining a number of duplicate rows of the delta rows, each of the duplicate rows forming an identical row byte value having delta bits which have a predetermined relationship with the delta bits of the highest order row; recording information indicative of the number of duplicate rows; and developing compressed data including the information indicative of the number of duplicate rows of the delta frame.

38 Claims, 8 Drawing Sheets

FIG. 10

SKIM ENCODING METHOD FOR COMPRESSION OF A TWO DIMENSIONAL ARRAY OF DATA

BACKGROUND OF THE INVENTION

1. Field of the Invention

The present invention relates generally to lossless data compression, and more specifically to a system and method providing for lossless compression of a two-dimensional array of data.

2. Description of Related Art

The quality of a digital image is a function of its resolution, which is a function of the number of pixels in the image array, and is also a function of the intensity range used to define each pixel position. Gray-scale images are considered as two-dimensional arrays of intensity values, digitized to some number of bits. Color images are usually represented in some color space (e.g., RGB, YUV, LAB), in which each component is a gray-scale image. In a typical high quality image system, 24 bits per pixel are used to display color and intensity variations. As the number of pixels increases, the resolution of the image increases. Also, as the intensity range used to define each pixel position increases, the quality of the image is enhanced. However, as resolution and intensity range increases, the amount of image data required to store or transmit the image increases proportionally. In order to reduce the number of digital bits required to store and/or transmit an image, compression is often performed.

Data compression refers to the temporary coding of data in a way that saves storage space or transmission time. The main objective of image data compression is to maximize picture quality while minimizing the amount of data required per pixel. Many different types of data compression techniques are known for reducing the number of bits required to represent information in data transmission or storage, thereby conserving bandwidth and/or memory.

Image compression algorithms are broadly classified into lossy (irreversible) schemes, for which the original pixel intensities cannot be perfectly recovered from the encoded bit stream, and lossless (reversible) schemes for which the coding algorithms yield decompressed images identical to the original digitized images. In general, lossless compression is required in applications where the images are subjected to further processing, e.g. for the purpose of extraction of specific information. Lossless compression is generally the choice also for images obtained at great cost, for which it may be unwise to discard any information that later may be found to be necessary, or in applications where the desired quality of the rendered image is unknown at the time of acquisition, as may be the case in digital photography. In addition, lossless compression may be preferred over lossy compression for applications where intensive editing or repeated compression/decompression is required as the accumulation of error due to a lossy iteration may become unacceptable. One particular field of application for lossless image data compression techniques is in computer generated imagery for motion pictures. Examples of lossless image data compression formats include RLA encoding used to generate Wavefront raster image files, and LZW encoding used for GIF files.

In general, data compression algorithms are based on the simple idea of mapping the representation of data from one group of symbols to another more concise series of symbols. Two schemes form the basis of many of the data compression algorithms currently known in the art. These are Huffman coding and LZW (for Lempel and Ziv, its creators, and Welch, who made substantial contributions) coding. Both Huffman and LZW coding are lossless compression techniques. Huffman coding reduces the number of bits used to represent characters that occur frequently in the data and increases the number of bits for characters that occur infrequently. The LZW method, on the other hand, encodes strings of characters, using the input data to build an expanded alphabet based on the strings that it sees. These two different approaches both work by reducing redundant information in the input data. Compression by Huffman coding requires that the compressor know or learn the probabilities of each type of data to compress. In order to learn the probabilities, Huffman coding performs two passes over the data requiring temporary storage of the entire data block, which is memory intensive especially for large databases. LZW, on the other hand, works by extending the alphabet using the additional characters to represent strings of regular characters. The key to the algorithm is the establishment of a table that matches character strings with code words representing strings. This table must exist as an index for translating between the stored or transmitted code and the original symbol. The use of such a table is also memory intensive.

Important performance parameters for compressed encoding processes include: speed of compression which is a function of the number of processing instructions required to be executed in order to generate the compressed data; and compression ratio which is defined by the size of an uncompressed data file divided by the size of the compressed version, expressing the degree to which a compression algorithm can reduce file size. There is an ever increasing demand for improved compressed encoding processes providing higher speeds of compression and higher compression ratios.

What is needed is an improved system and method for compressing and decompressing image data wherein the system and method provides a higher speed of compression and a higher compression ratio than prior art compression systems.

SUMMARY OF THE DISCLOSURE

Embodiments of the present invention provide a data compression process having an improved compression ratio over prior art image data compression processes.

Briefly, embodiments of the present invention provide a process of compressing a two dimensional array of data in the form of a pixel map including an array of pixels having at least one array block having a plurality of N block rows and a plurality of M block columns of the pixels, each pixel having at least one associated X-bit intensity value. The process includes an initial step of generating a first delta frame associated with a first pair of the block columns including first and second adjacent block columns, the first delta frame having a predetermined plurality of delta rows and N delta columns of delta bits, each delta column forming a delta byte having the predetermined plurality of bits and being indicative of a difference between the intensity byte values of a corresponding adjacent pair of pixels disposed in a corresponding one of the block rows and in the first and second block columns, each delta row forming an N-bit row byte, wherein a highest order one of the delta rows is a sign row forming a sign byte having N sign bits each being associated with a corresponding one of the adjacent pairs of pixels and indicating whether the difference between the intensity byte values of the corresponding adjacent pair of pixels is positive or negative.

The compression process also includes the steps of: determining a skim row of the first delta frame, the skim row being a highest order one of the delta rows less than the order of the sign row and forming a skim row byte having at least one delta bit that is different from a corresponding one of the sign bits of the sign row; and determining a first height value associated with the first delta frame, the first height value indicating a number of the delta rows of the first delta frame that are lower order rows than the skim row.

The compression process also includes a step of generating a second delta frame associated with a second pair of the block columns including the second block column and an adjacent third block column, the second delta frame having the predetermined plurality of delta rows and N delta columns of associated delta bits, each delta column forming a delta byte having the predetermined plurality of bits and being indicative of a difference between the intensity byte values of a corresponding adjacent pair of pixels disposed in a corresponding one of the block rows and in the second and third block columns, each delta row forming an N-bit row byte, wherein a highest order one of the delta rows is a sign row forming a sign byte having N sign bits each being associated with a corresponding one of the adjacent pairs of pixels and indicating whether the difference between the intensity byte values of the corresponding adjacent pair of pixels is positive or negative.

The compression process further includes the steps of: determining a skim row of the second delta frame, the skim row being a highest order one of the delta rows of the second delta frame less than the order of the sign row and forming a skim row byte having at least one delta bit that is different from a corresponding one of the sign bits of the sign row of the second delta frame; determining a second height value associated with the second delta frame, the second height value indicating a number of delta rows of the second delta frame that are lower order rows than the skim row; determining a height difference value between the first and second height values; and determining a Huffman code value associated with the first delta frame based on the height difference value and the skim row byte of the first delta frame.

Note that steps corresponding to the above described steps associated with the second delta frame are performed for each subsequent one of the block columns to develop compressed data including the Huffman code values.

In one embodiment, the step of determining a Huffman code value further includes: determining a dictionary element by concatenating the skim row byte of the first delta frame and the height difference value; and using the dictionary element to reference a Huffman code table to determine the Huffman code value associated with the first delta frame.

The step of determining a first height value associated with the first delta frame includes recording the delta bit values of the delta rows of the first delta frame that are lower order rows than the skim row of the first delta frame, and the step of determining a second height value associated with the second delta frame includes recording the delta bit values of the delta rows of the second delta frame that are lower order rows than the skim row of the second delta frame. These recorded delta bits are literally encoded within the compressed data.

The step of determining a skim row of the first delta frame includes: determining a number of duplicate sign rows of the first delta frame, each duplicate row being a higher order row than the skim row and a lower order row than the sign row of the first delta frame; and recording information indicative of the number of duplicate sign rows of the first delta frame.

In one embodiment, the step of generating a first delta frame includes: determining a first word value by concatenating each of the X-bit intensity byte values of the pixels of the first block column; determining a second word value by concatenating each of the X-bit intensity byte values of the pixels of the second block column; determining a delta word value by subtracting the second word value from the first word value; and subdividing the delta word value into a plurality of N X-bit delta values each providing one of the delta bytes. In this embodiment, the step of generating the second delta frame includes: determining a third word value by concatenating each of the X-bit intensity byte values of the pixels of the third block column; determining a delta word value by subtracting the third word value from the second word value; and subdividing the delta word value into a plurality of N X-bit delta values each providing one of the delta bytes of the second delta frame.

An important advantage of the data compression process of the present invention is that it provides an improved compression ratio over prior art data compression processes.

Another advantage of the compression process the present invention is that it is a lossless compression process.

The foregoing and other features and advantages of the present invention will be apparent from the following detailed description of embodiments of the present invention which makes reference to the several figures of the drawing.

DETAILED DESCRIPTION OF PREFERRED EMBODIMENTS

In the following description of embodiments of the present invention, reference is made to the accompanying drawings which form a part hereof, and in which is shown by way of illustration specific embodiments in which the invention may be practiced. It is to be understood that other embodiments may be utilized and structural changes may be made without departing from the scope of the described embodiments of the present invention.

Arrays of data that represent values measured from a physical source are usually well spatially correlated. In other words, in the array there is usually a statistically small relative variation between a value of a given element of an array and values of its neighbors. For example in a two dimensional array of pixels, the color values of neighboring pixels are likely to be very close. At the bit level, this suggests that the high order bits of an element of such an array are statistically similar to the high order bits of its neighbors, while the low order bits are relatively poorly spatially correlated. Many algorithms can be devised to take advantage of this observation. For example, simple run-length encoding bit slices can, depending on the data and implementation, compress better and faster than LZW compression.

However even better results can be accomplished by pursuing the main strategy of skim encoding in accordance with the present invention. As further explained below, in accordance with the skim encoding process of the present invention, high order bits of an array of data are separated (skimmed off) from the low order bits. Then, the high order bits can be encoded with an efficient statistical method (such as, but not limited to, Huffman encoding), while the low order bits can be treated as random bits and stored most efficiently as their literal values. The challenges of an implementation are to efficiently arrange the data to maximize the "skimmable bits", minimize the number of poorly correlated low order bits, and to efficiently encode the skimmed bits. In particular this strategy can be enhanced by considering deltas, that is differences, between neighboring elements of the array rather than the values themselves, as the deltas will almost always have fewer significant bits.

To optimize the speed of compression, the largest size of the CPU's registers for performing integer operations is of prime importance. If the data to be compressed is appropriately arranged, larger registers can operate on more bits and thus process the data faster. Increasingly CPUs are equipped with 64-bit registers, and nearly all modern CPUs have 32-bit registers. In the embodiment described below, the present invention most effectively takes advantage of 64-bit registers.

Figure 1:
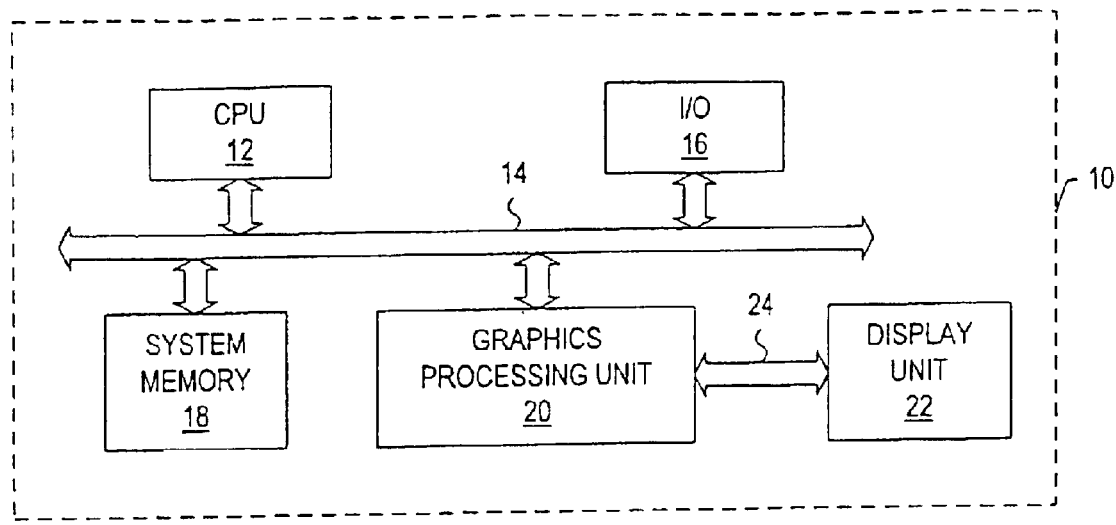
FIG. 1 is a generalized block diagram illustrating an exemplary computer graphics system that may be used to execute a data compression process in accordance with the present invention.

FIG. 1 shows a generalized block diagram illustrating a computer system at 10 that may be used to execute a image data compression process in accordance with the present invention as further explained below. The computer system 10 generally includes: a central processing unit (CPU) 12 communicatively coupled with a system bus 14; an input/output unit 16, a system memory unit 18, and a graphics processing unit 20 each being communicatively coupled with the CPU 12 via the system bus 14; and a display unit 22 communicatively coupled with the graphics processing unit 20 via an interface 24.

In one embodiment, computer readable instructions are executed by the CPU 12 to implement the image data compression process of the present invention. Uncompressed image data may be stored in the system memory unit 18. Uncompressed data is usually stored in memory as two-dimensional arrays. However, it is common for conversion and compositing programs to process a few scan lines (rows) at a time. In such cases, the compressed data is only conceptually a two-dimensional array, and only a few scan lines are actually stored in memory at a time. The skim encoding process of the present invention would require that at least N rows (e.g., N=8 rows) be in memory at a time.

In accordance with well known processes, the original uncompressed image data may be processed to display an image on the display unit 22. As further explained below, the original uncompressed image data may be accessed from the system memory unit 18, processed to generate compressed format image data in accordance with the compression process of the present invention, and stored in the system memory unit 18. This compressed data occupies less memory space of the system memory unit 18 than the uncompressed data. Note that the compressed image data may be stored in any computer readable storage unit more efficiently than the original uncompressed image data. Also, note that transmission of the compressed image data (e.g., from the computer system 10 to another computer system or device that is not shown) is more efficient than transmission of the original uncompressed data because the compressed image data includes less data and may be transmitted faster. After storage or transmission, the compressed image data may later be uncompressed in accordance with a decompression process of the present invention, and displayed on a display such as the display unit 22. Note that because the compression process of the present invention is loss-less, there is no degradation in the image generated based on the decompressed data as compared with the image generated using the original uncompressed data.

Figure 2:
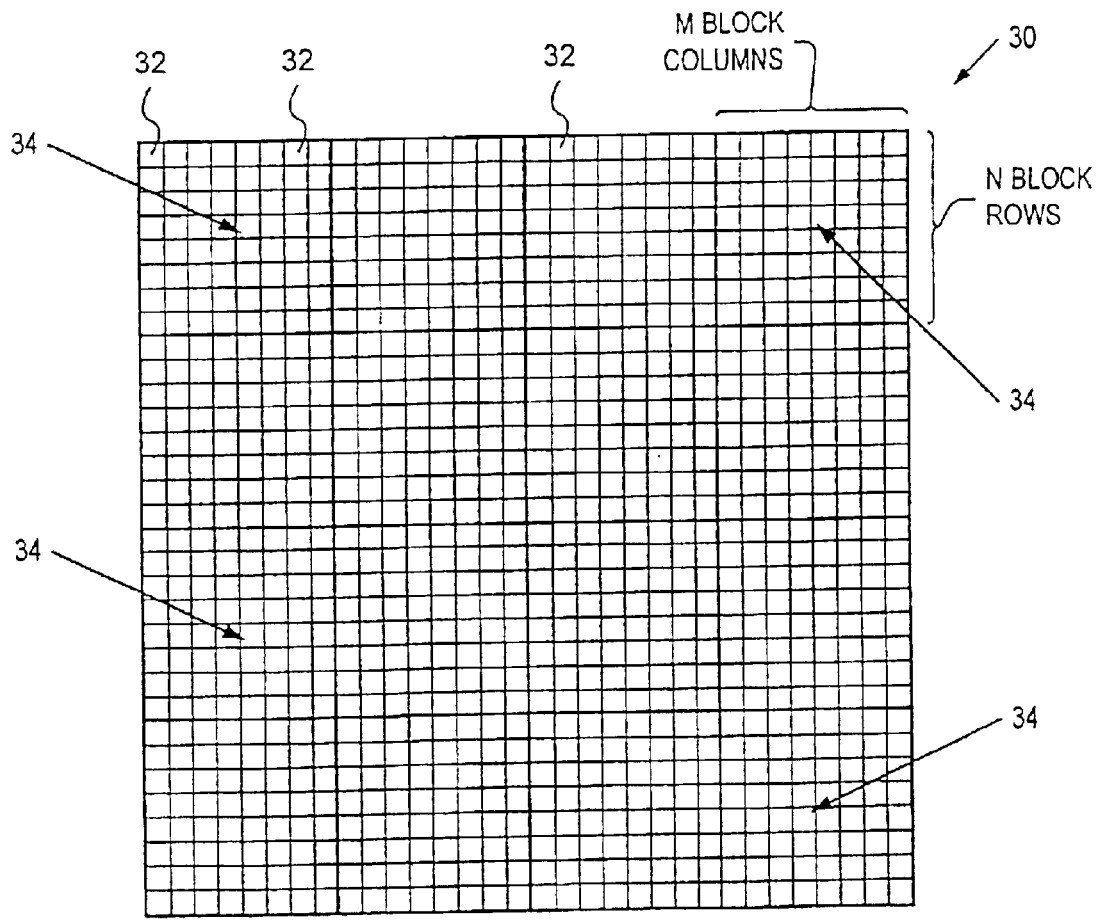
FIG. 2 is a block diagram generally illustrating a pixel map of an image including an array of pixels having at least one array block of N block rows and M block columns of pixels each having at least one associated X-bit intensity byte value.

FIG. 2 shows a block diagram generally illustrating a pixel map at 30 representing an image and including an array of pixels 32 having at least one array block 34 of N block rows and M block columns of pixels. Note that the skim encoding process of the present invention provides for encoding N full scan lines at a time. Each of the pixels 32 has at least one associated X-bit intensity byte value which is to be encoded in accordance with the compression process of the present invention as further explained below. In an RGB display embodiment, each of the pixels 32 has three 8-bit chrominance byte values associated therewith, each chrominance value representing one of the red, blue, and green chrominance values. In a grayscale embodiment, each of the pixels 32 has one 8-bit intensity byte value associated therewith for representing a shade of gray.

In accordance with one embodiment of the compression process of the present invention, each of the array blocks 34 is encoded as a unit. Also in one embodiment, the array block 34 of N block rows and M block columns of pixels is an 8×8 array block. The dimensions of the entire pixel map 30 may vary in accordance with the present invention. In a film resolution image embodiment, the pixel map 30 includes 1556 rows or scan lines, and 2048 pixels per scan line. Because the number 1556 is a multiple of 4 (but not a multiple of 8), encoding using an 8×8 array block 34 in the film resolution image embodiment would result in there being an extra four scan lines that need to be encoded. This problem is easily solved by creating an extra array block including the extra four scan lines and four zero value scan lines of pixels (each having intensity byte values of all zeros). This extra array block may then be encoded in the same manner as the full value array blocks are encoded in accordance with the compression process of the present invention as further explained below.

Figures 3, 4:
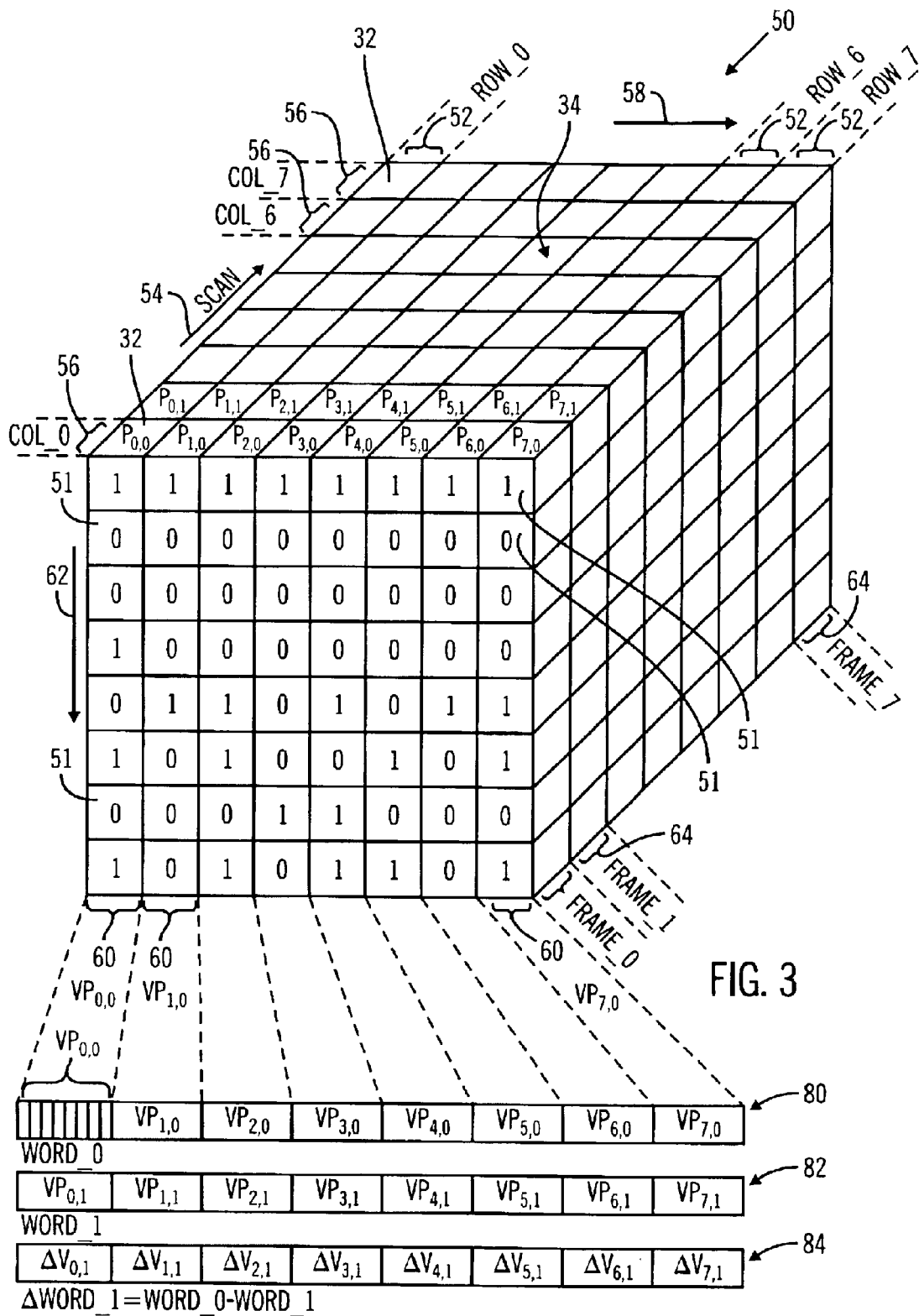
FIG. 3 is a block diagram generally illustrating a three-dimensional array of intensity bit values of an array block of pixels.
FIG. 4 is a block diagram illustrating word values generated in order to determine an (X*N)-bit delta word value indicative of differences between the intensity byte values of adjacent pairs of pixels in adjacent block columns of the array block, the delta word value being used in accordance with a fast encoding embodiment of the compression process of the present invention.

FIG. 3 shows a block diagram generally illustrating a three-dimensional array at 50 of intensity bit values 51 associated with each of the pixels 32 of an array block 34 of a pixel map. In the depicted embodiment, the array block 34 includes N=8 block rows 52 of pixels designated ROW_0, ROW_1, ... ROW_7, the pixels 32 of each row 52 being disposed along an associated scan line that is parallel to a scan axis 54; and M=8 block columns 56 designated COL_0, COL_1, ... COL_7 of pixels 32, the pixels of each block column 56 being disposed along a line parallel to a column axis 58. Each of the pixels is designated $P_{n,m}$ wherein the n value indicates the row position of the associated pixel, and the m value indicates the column position of the associated pixel. The pixels in the first block column COL_0 are designated $P_{0,0}, P_{1,0}, \ldots, P_{7,0}$, and the pixels in the second block column COL_1 are designated $P_{0,1}, P_{1,1}, \ldots, P_{7,1}$ etc. The three-dimensional array 50 further includes a plurality of (N*M) X-intensity value columns 60 each being associated with one of the pixels 32 and forming an associated X-bit intensity byte value $VP_{n,m}$ having X bits shown distributed along an associated line that is parallel to an intensity column axis 62 in the associated intensity column. In the depicted embodiment, X=8. Each set of N X-bit intensity values $VP_{n,m}$ associated with one of the block columns 56 forms an (N*X=64)-bit frame 64 of intensity bits. The depicted three-dimensional array 50 includes M=8 frames 64 of intensity bit values 51 designated FRAME_0, FRAME_1, ..., FRAME_7, each frame 51 being associated with a corresponding one of the block columns COL_0, COL_1, ... COL_7 of pixels.

FIG. 4 shows a block diagram generally illustrating: a first (N*X)-bit word value 80 designated WORD_0 which is generated by concatenating each of the X-bit intensity bytes $VP_{0,0}, VP_{1,0}, \ldots, VP_{7,0}$ associated with the pixels of COL_0 (FIG. 3) of the three-dimensional array block; a second (N*X)-bit word value 82 designated WORD_1 which is generated by concatenating each of the X-bit intensity bytes $VP_{0,1}, VP_{1,1}, \ldots, VP_{7,1}$ associated with the pixels of COL_1 (FIG. 3) of the three-dimensional array bock; and a first (N*X)-bit delta word value 84 designated ΔWORD_1 which is generated by subtracting WORD_1 from WORD_0, wherein the subtraction is performed modulo 2**(N*X) so that any overflow bits are discarded. The (N*X)-bit delta word value 84 designated ΔWORD_1 includes N X-bit delta bytes designated $\Delta V_{0,1}, \Delta V_{1,1}, \ldots, \Delta V_{7,1}$ each having X delta bits. Note that this operation is invertible in that WORD_1=WORD_0−ΔWORD_1 modulo 2**(N*X).

The first and second 64-bit words WORD_0 and WORD_1 are generated based on the X-bit intensity values of the pixels of the first and second block columns COL_0 and COL_1 respectively. The delta word value 84 is used in accordance with a fast encoding embodiment of the image data compression process of the present invention as further explained below. In the described embodiment, the delta word value 84 is modulo2**64, that is a 64-bit delta value.

Figure 5:
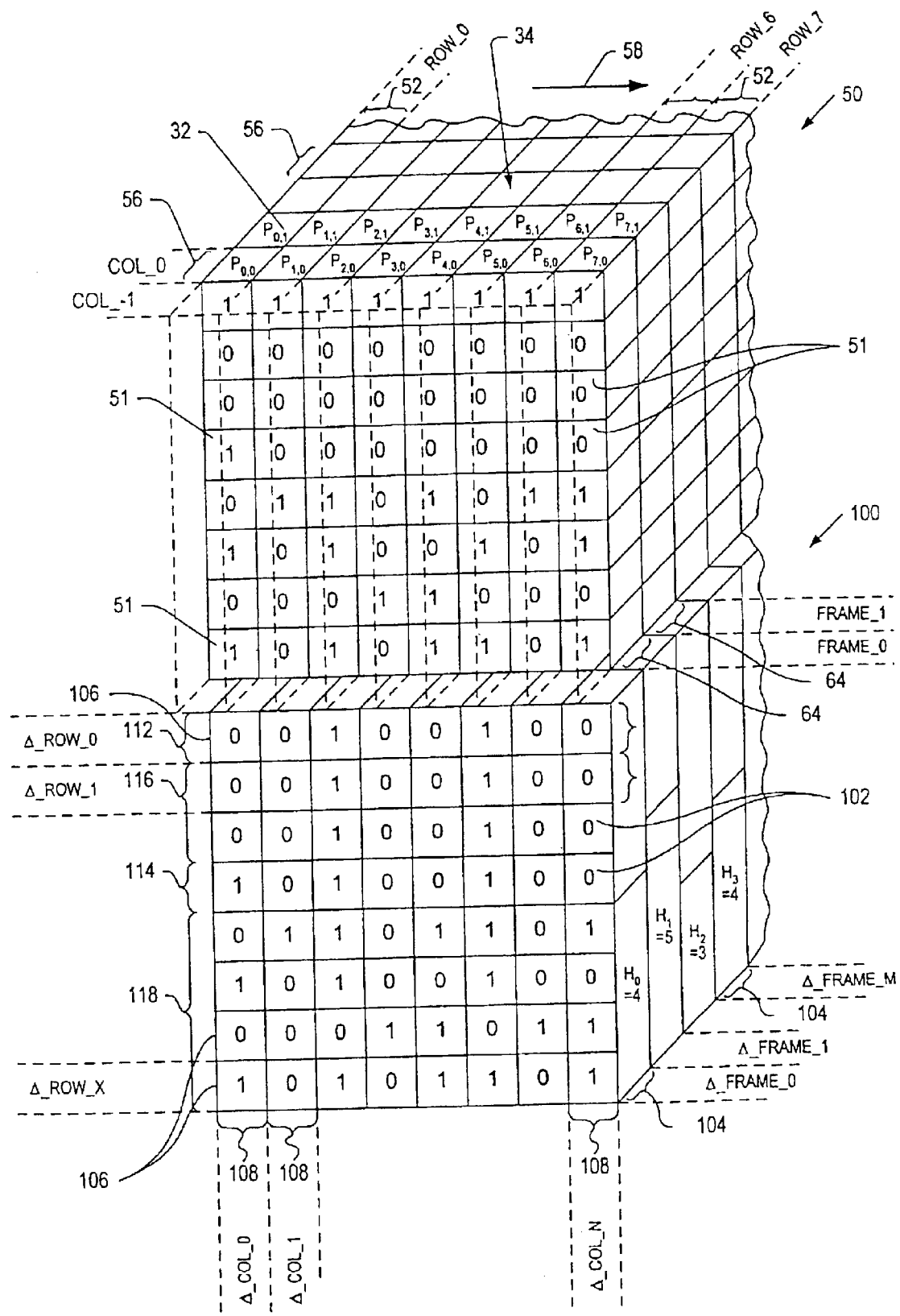
FIG. 5 is a block diagram generally illustrating a three-dimensional delta array of delta bits generated for an array block, the delta array including a plurality of M delta frames each having a predetermined plurality of delta rows by N delta columns of delta bits, each delta frame being associated with one of the block columns of the array block, each delta column forming an X-bit delta byte having a value indicative of a difference between the intensity byte values of an associated adjacent pair of pixels in associated adjacent block columns of the array block, the delta array being used in accordance with the image data compression process of the present invention.

FIG. 5 shows a block diagram generally illustrating a cut-away portion of a three dimensional delta array at 100 of delta bits 102 generated based on the intensity bit values 51 associated with the pixels 32 of the array block 34 (FIG. 3) in accordance with steps of the image data compression process of the present invention as further explained below. The three dimensional delta array 100 includes M delta frames 104 of delta bits 102, the frames 104 being designated ΔFRAME_0, ΔFRAME_1, ..., ΔFRAME M−1, each frame 104 having X delta rows 106 of delta bits designated ΔROW_0, ΔROW_1, ..., ΔROW_X−1, and N delta columns 108 of delta bits 102 designated ΔCOL_0, ΔCOL_1, ..., ΔCOL_N−1 as further explained below. The delta bits of each delta column 108 form an X-bit delta byte.

Each of the M delta frames 104 of delta bits 102 is generated based on the intensity bit values 51 of pixels 32 of an associated adjacent pair of the block columns 56 of the array block 34. Note that the delta bits 102 of the first delta frame ΔFRAME_0 are generated based on the intensity byte values of pixels 32 of the first block column COL_0 and intensity byte values of an imaginary block column of pixels designated COL_−1, each pixel of COL−1 having an X-bit intensity byte value of zero. Therefore, the imaginary block column COL_−1 forms an (N*X)-bit frame of intensity bit values 51 each having a bit value of zero.

The "Xth" delta row may be referred to as the sign row because if the bit corresponding to the DELTA_V[k,i] is "1" then (with inconsequential exceptions) V[k−1,i]<V[k,i]. Alternatively, if the bit corresponding to the DELTA_V[k,i] is "0", then V[k−1,i]>V[k,i]. The inconsequential exceptions are due to subtracting the 64-bit word quantities, rather than doing 8 separate 8 bit subtractions (as described below as a first embodiment of the compression process). These exceptions make it mathematically inaccurate to call the Xth row the sign row. So the term should be taken as descriptive rather than mathematically accurate.

In a first embodiment of the compression process, each X-bit delta byte formed by a delta column 108 is determined simply by subtracting the X-bit intensity byte value of the associated first pixel 32 from the X-bit intensity byte value of the corresponding second pixel disposed in the same block row and in the adjacent block column relative to the first pixel. As an example, intensity byte values $\Delta V_{0,0}, \ldots, \Delta V_{1,0}, \ldots, \Delta V_{7,0}$ of the first delta frame ΔFRAME_0 are determined by subtracting the X-bit intensity bytes $VP_{0,0}, VP_{1,0}, \ldots, VP_{7,0}$ associated with the pixels of COL_0 from the X-bit intensity bytes $VP_{0,-1}, VP_{1,-1}, \ldots, VP_{7,-1}$ associated with the pixels of COL_−1 respectively. In other words, more generally: DELTA_VP[I,j]=VP[I,j]−VP[i−1,j] mod 28 for i=0 to M−1, and for j=0 to N−1. The "byte at a time" arithmetic is all done modulo 28.

In a faster encoding embodiment of the compression process, the delta bits 102 of each delta frame 104 are determined by a process including the steps of: determining a first (N*X)bit word value by concatenating each of the X-bit intensity bytes of the pixels of a first one of the block columns 56 (FIG. 3); determining a second (N*X)-bit word value by concatenating each of the X-bit intensity bytes of the pixels of a second one of the block columns 56 (FIG. 3) that is adjacent the first block column; determining a (N*X)-bit delta word value by subtracting the second (N*X)-bit word value from the first (N*X)-bit word value; and subdividing the (N*X)-bit delta word value into a plurality of N X-bit delta values each providing an associated one of the delta bytes of an associated one of the delta columns 108 of the associated delta frame 104. Note that for a delta frame of delta bits generated in accordance with the faster encoding embodiment of the compression process, the values of the delta bytes formed by the delta columns 108 are not mathematically equal to the difference between the X-bit intensity byte values of associated pixels disposed in a corresponding block row 52 and in adjacent block columns 56. However, as further explained below, the delta bits of a delta frame generated in accordance with the faster encoding embodiment have similar statistical properties to the "one byte at a time" embodiment mentioned above, which allow for skim encoding as further explained below. Note that the faster encoding embodiment is faster because it does one 64-bit subtraction rather than eight 8-bit subtractions.

As an example of determining a delta frame 104 in accordance with the faster encoding embodiment, the delta bits of ΔFRAME_1 are determined by a process including the steps of: determining a first (N*X)-bit word value 80 (FIG. 4) designated WORD_0 which is generated by concatenating each of the X-bit intensity bytes of the first block column 56 designated COL_0; determining a second (N*X)-bit word value 82 (FIG. 4) designated WORD_1 which is generated by concatenating each of the X-bit intensity bytes of the second block column 56 designated COL_1 that is adjacent COL_0; determining an (N*X)-bit delta word value 84 (FIG. 4) designated ΔWORD_1 by subtracting WORD_1 from WORD_0; and subdividing ΔWORD_1 into N X-bit delta bytes $\Delta V_{0,1}, \Delta_{1,1}, \ldots, \Delta V_{n-1,1}$, each providing an associated one of the delta bytes of an associated one of the delta columns 108 ΔCOL_0, ΔCOL_1, ..., ΔCOL_N−1 of FRAME_1. The only difference between the two described embodiments is that in the first embodiment, a "byte at a time" subtraction is performed to determine the DELTA_FRAME, while in the faster embodiment, a 64-bit subtraction is performed. All successive steps are the same for the two embodiments.

Each of the delta rows 106 forms an N-bit delta row byte. The delta bits of the first delta row 106 designated Δ_ROW_0 (sign row 112) are sign bits forming an N-bit sign byte. Each of the sign bits of the sign byte in sign row 112 is associated with a corresponding one of the X-bit delta bytes formed by an associated one of the delta columns 108, and indicates whether the associated X-bit delta byte value is negative or positive. As mentioned, the sign row is descriptive rather than mathematically accurate.

As mentioned above, in the first embodiment, each of the X-bit delta bytes formed by the delta bits 102 of the delta columns 108 is determined based on the difference between X-bit intensity byte values of adjacent pixels 32 disposed in a corresponding block row 52 and in adjacent block columns 56. Because nearby pixels tend to have similar intensity byte values, the X-bit delta bytes tend to have higher order bits including a string of highest order zero-value bits (for positive delta byte values) or a string of highest order one-value bits (for negative delta byte values). Therefore, in accordance with statistical results, the highest order ones of the delta row bytes formed by corresponding sets of the delta rows 106 adjacent the sign row 112 tend to be equal. These rows are referred to herein as "duplicate sign rows" and, as further explained below, the compression process of the present invention takes advantage of the redundancy in the delta bits of these duplicate sign rows in accordance with a skim encoding process.

Note also that redundant duplicate sign rows also arise in delta frames 104 generated in accordance with the faster encoding embodiment (described above with reference to FIG. 4) wherein the delta bits 102 of each delta frame 104 are generated based on the difference between the concatenated (N*X)-bit word values. Each of the X-bit delta bytes $\Delta V_{n,m}$ of each delta word value 84 (FIG. 4) includes higher order bits which are equal to the higher order bits of X-bit delta bytes determined based on the difference between X-bit intensity byte values of adjacent pixels 32 disposed in a corresponding block row 52 and in adjacent block columns 56. Therefore, redundancy in the delta bits of duplicate sign rows may be taken advantage of in accordance with the faster encoding embodiment.

In accordance with the compression process of the present invention, for each of the M delta frames 104 associated with one of the block columns 56, a number of duplicate sign rows must be determined. In general, the number of duplicate sign rows is determined by identifying the highest order delta row 106 which is different from the sign row. The number of duplicate sign rows may be determined by first determining a skim row 114 which is determined as the highest order one of the delta rows 106 less than the order of the sign row 112 and forming an N-bit skim row byte that has at least one varying delta bit 102 that is different from an associated one of the sign bits of the sign row 112 that is located in the same one of the delta columns 108.

Each of the delta rows 106 of an order between the order of the skim row 114 and the order of the sign row 112 has delta bit values 102 identical to sign bit values of the sign row 112 and is designated as a "duplicate sign row" 116.

As further explained below, the duplicate sign rows 116 need not be encoded literally in the compressed format because each of the duplicate sign rows 116 is identical to the sign row 112. It is however necessary to record information indicative of the number of duplicate sign rows 116 for each delta frame.

Note that the skim rows 114 (FIG. 5) of each delta frame 104 tend to have properties which are amenable to efficient Huffman coding because the number of "1" values in each of the skim rows 114 tends to be very small, and therefore certain combinations of "1"s and "0"s tend to arise more frequently than others. This property makes the skim rows 114 suitable for Huffman encoding as further explained below.

In accordance with the compression process, for each of the M delta frames 104 associated with one of the block columns 56, an associated height value $H_m$ is determined. The height value $H_m$ indicates a number of literal rows 118 including all of the delta rows 106 that are lower order rows than the skim row 114. Note that the height value $H_m$ determined for each of the M delta frames 104 provides information indicative of the number of duplicate sign rows in the associated delta frame. Specifically, the number of duplicate sign rows may be determined as $X-H_m$.

In accordance with the compression process of the present invention, a sign row 112, skim row 114, duplicate sign rows 116, literal rows 118, and associated height value $H_{CURRENT}$ are determined for the current delta frame 104 associated with a current one of the block columns 56 of pixels. Subsequently, a sign row 112, skim row 114, duplicate sign rows 116, literal rows 118, and associated height value $H_{NEXT}$ are determined for the next delta frame 104 associated with a next one of the block columns 56 of pixels. Subsequently, a height difference value ΔH associated with the current delta frame is determined by determining a difference between the height value $H_{CURRENT}$ associated with the current block column and the height value $H_{NEXT}$ associated with the next block column. As an example, the height value $H_0$ associated with ΔFRAME_0 has a value of 4, and the height value $H_1$ associated with ΔFRAME_1 has a value of 5, and therefore the height difference value $\Delta H_0$ associated with ΔFRAME_0 has a value of $(H_0-H_1)(4-5)=-1$.

Figure 10:
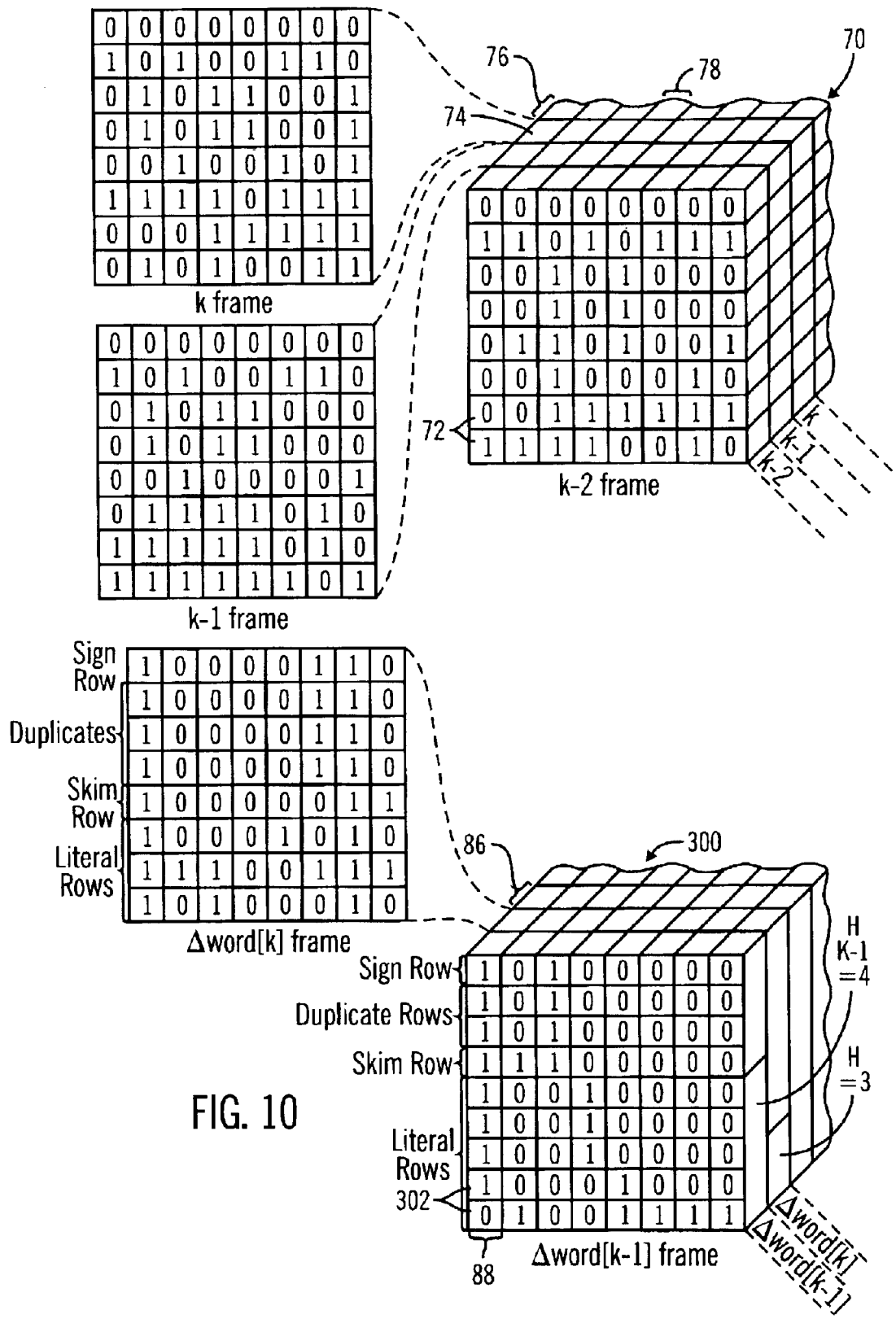
FIG. 10 is a block diagram generally illustrating a three-dimensional delta array of delta bits generated for an array block, the delta array including a plurality of delta frames each having a predetermined plurality of delta rows by N delta columns of delta bits, each delta frame being associated with one of the block columns of the array block, each delta column forming an X-bit delta byte having a value indicative of a difference between the intensity byte values of an associated adjacent pair of pixels in associated adjacent block columns of the array block, the delta array being used in accordance with the image data compression process of the present invention.

An example is provided with typical real world numbers. FIG. 10 shows a block diagram generally illustrating a cut-away portion of a three dimensional delta array at 300 of delta bits 302 generated based on the intensity bit values 72 associated with the pixels 74 of the three-dimensional array 70 in accordance with steps of the image data compression process of the present invention. The three-dimensional array 70 includes N block rows 78 and M block columns 76 of pixels. The delta array includes a plurality of delta frames each having a predetermined plurality of delta rows 86 by N delta columns 88 of delta bits 302, each delta frame being associated with one of the block columns 76 of the three-dimensional array 70, each delta column 88 forming an X-bit delta byte having a value indicative of a difference between the intensity byte values of an associated adjacent pair of pixels in associated adjacent block columns 76 of the three-dimensional array 70. Frames k–2, k–1 and k of three-dimensional array 70 are shown in FIG. 10. Assume that frame k is an arbitrary frame in the middle of the array block. Delta frames Δword k–1 and Δword k of three dimensional delta array 300 are shown in FIG. 10.

For the index k–2 frame assume:

|  | decimal | hex | Binary |
|---|---|---|---|
| VP[k-2,0] = | 65 | 0x41 | 0b01000001 |
| VP[k-2,1] | 73 | 0x49 | 0b01001001 |
| VP[k-2,2] | 63 | 0x3f | 0b00111111 |
| VP[k-2,3] | 67 | 0x43 | 0b01000011 |
| VP[k-2,4] | 58 | 0x3a | 0b00111010 |
| VP[k-2,5] | 66 | 0x42 | 0b01000010 |
| VP[k-2,6] | 71 | 0x47 | 0b01000111 |
| VP[k-2,7] | 74 | 0x4a | 0b01001010 |

For the index k–1 frame assume:

|  | decimal | hex | Binary |
|---|---|---|---|
| VP[k-1,0] = | 67 | 0x43 | 0b01000011 |
| VP[k-1,1] | 55 | 0x37 | 0b00110111 |
| VP[k-1,2] | 79 | 0x47 | 0b01001111 |
| VP[k-1,3] | 55 | 0x37 | 0b00110111 |
| VP[k-1,4] | 55 | 0x37 | 0b00110111 |
| VP[k-1,5] | 65 | 0x41 | 0b01000001 |
| VP[k-1,6] | 70 | 0x46 | 0b01000110 |
| VP[k-1,7] | 73 | 0x49 | 0b01001001 |

And for the index k frame assume:

|  | decimal | hex | Binary |
|---|---|---|---|
| VP[k,0] | 68 | 0x44 | 0b01000100 |
| VP[k,1] | 53 | 0x35 | 0b00110101 |
| VP[k,2] | 76 | 0x4c | 0b01001100 |
| VP[k,3] | 55 | 0x37 | 0b00110111 |
| VP[k,4] | 50 | 0x32 | 0b00110010 |
| VP[k,5] | 78 | 0x4e | 0b01001110 |
| VP[k,6] | 71 | 0x47 | 0b01000111 |
| VP[k,7] | 63 | 0x3f | 0b00111111 |

Then the k–2 frame (also shown in FIG. 10) would be:

| 0 | 0 | 0 | 0 | 0 | 0 | 0 | 0 |
|---|---|---|---|---|---|---|---|
| 1 | 1 | 0 | 1 | 0 | 1 | 1 | 1 |
| 0 | 0 | 1 | 0 | 1 | 0 | 0 | 0 |
| 0 | 0 | 1 | 0 | 1 | 0 | 0 | 0 |
| 0 | 1 | 1 | 0 | 1 | 0 | 0 | 1 |
| 0 | 0 | 1 | 0 | 0 | 0 | 1 | 0 |
| 0 | 0 | 1 | 1 | 1 | 1 | 1 | 1 |
| 1 | 1 | 1 | 1 | 0 | 0 | 1 | 0 |

The k–1 frame (also shown in FIG. 10) would be:

| 0 | 0 | 0 | 0 | 0 | 0 | 0 | 0 |
|---|---|---|---|---|---|---|---|
| 1 | 0 | 1 | 0 | 0 | 1 | 1 | 1 |
| 0 | 1 | 0 | 1 | 1 | 0 | 0 | 0 |
| 0 | 1 | 0 | 1 | 1 | 0 | 0 | 0 |
| 0 | 0 | 1 | 0 | 0 | 0 | 0 | 1 |
| 0 | 1 | 1 | 1 | 1 | 0 | 1 | 0 |
| 1 | 1 | 1 | 1 | 1 | 0 | 1 | 0 |
| 1 | 1 | 1 | 1 | 1 | 1 | 0 | 1 |

And the k frame (also shown in FIG. 10) would be:

| 0 | 0 | 0 | 0 | 0 | 0 | 0 | 0 |
|---|---|---|---|---|---|---|---|
| 1 | 0 | 1 | 0 | 0 | 1 | 1 | 0 |
| 0 | 1 | 0 | 1 | 1 | 0 | 0 | 1 |
| 0 | 1 | 0 | 1 | 1 | 0 | 0 | 1 |
| 0 | 0 | 1 | 0 | 0 | 1 | 0 | 1 |
| 1 | 1 | 1 | 1 | 0 | 1 | 1 | 1 |
| 0 | 0 | 0 | 1 | 1 | 1 | 1 | 1 |
| 0 | 1 | 0 | 1 | 0 | 0 | 1 | 1 |

Then (in binary representation)

WORD[k–2]=01000001 01001001 00111111 01000011 00111010 01000010 01000111 01001010;

WORD[k–1]=01000011 00110111 01001111 00110111 00110111 01000001 01000110 01001001; and WORD[k]=01000100 00110101 01001100 00110111 00110010 01001110 01000111 00111111.

Then, DELTA_WORD[k–1] may be expressed as:

DELTA_WORD[k–1]=WORD[k–2]-WORD[k–1], and

DELTA_WORD[k] may be expressed as,

DELTA_WORD[k]=WORD[k–1]-WORD[k]

Thus, DELTA_WORD[k-1]=11111110 00010001 11110000 00001100 00000011 00000001 00000001 00000001 and DELTA_WORD[k]=11111111 00000010 00000011 00000000 00000100 11110010 11111111 00001010

Arranged once again in block form, DELTA_FRAME [k−1] may be expressed as shown below and in FIG. 10:

| 1 | 0 | 1 | 0 | 0 | 0 | 0 | 0 | <- sign row |
|---|---|---|---|---|---|---|---|---|
| 1 | 0 | 1 | 0 | 0 | 0 | 0 | 0 | <\| |
| 1 | 0 | 1 | 0 | 0 | 0 | 0 | 0 | <\| - duplicates of sign row |
| 1 | 1 | 1 | 0 | 0 | 0 | 0 | 0 | <- skim row H[k−1] = 4 |
| 1 | 0 | 0 | 1 | 0 | 0 | 0 | 0 | <\| |
| 1 | 0 | 0 | 1 | 0 | 0 | 0 | 0 | <\| |
| 1 | 0 | 0 | 0 | 1 | 0 | 0 | 0 | <\| |
| 0 | 1 | 0 | 0 | 1 | 1 | 1 | 1 | <\| - literal rows |

DELTA_FRAME[k] may be expressed as below,

| 1 | 0 | 0 | 0 | 0 | 1 | 1 | 0 | <- sign row |
|---|---|---|---|---|---|---|---|---|
| 1 | 0 | 0 | 0 | 0 | 1 | 1 | 0 | <\| |
| 1 | 0 | 0 | 0 | 0 | 1 | 1 | 0 | <\| |
| 1 | 0 | 0 | 0 | 0 | 1 | 1 | 0 | <\| - duplicates of sign row |
| 1 | 0 | 0 | 0 | 0 | 0 | 1 | 1 | <- skim row, H[k] = 3 |
| 1 | 0 | 0 | 0 | 1 | 0 | 1 | 0 | <\| |
| 1 | 1 | 1 | 0 | 0 | 1 | 1 | 1 | <\| |
| 1 | 0 | 1 | 0 | 0 | 0 | 1 | 0 | <\| - literal rows |

Then ΔH[k]=(4−3)=1.

In one embodiment of the present invention, the skim row 114 is determined by performing XOR operations between each sign bit of the sign row 112 and each bit of the successively lower order delta rows 106 (FIG. 5). In one implementation of this embodiment, each of the delta bytes formed by one of the delta rows 106 is transposed, and then the transposed rows are shifted and XOR operations performed until the skim row 114 is determined. This implementation also yields the positions of each of the bit values of the skim row 114 which varies from an associated bit value of the sign row.

In another embodiment of the present invention the skim row 114 and the number of duplicate sign rows are determined by transposing the rows and columns of DELTA_FRAME[k] 104 (FIG. 5). To accomplish this each of the X-bit DELTA_VP[k,j] bytes is used as an index into a 2**X bit array TRANS of N*X bit quantities. This array is arranged such that a bit [i] of a given index is mapped to the bit i*X of the result.

For example: if DELTA_VP[k,j]=01001010, then TRANS[DELTA_VP[k,j]]=00000000 10000000 00000000 00000000 10000000 00000000 10000000 00000000, then the result of each look up is then shifted by X−k bits to the right, and the results are combined through a bit-wise OR operation.

Thus from the preceding example

DELTA_WORD[k]=11111111 00000010 00000011 00000000 00000100 11110010 11111111 00001010

TRANSPOSED DELTA_WORD[k]=10000110 10000110 10000110 10000110 10000011 10001010 11100111 10100010

The TRANSPOSED DELTA_WORD[k] is then broken up into X N-bit bytes. The number of duplicate sign rows can then be easily determined by just counting the number of these bytes that are equal to the first. The skim row is then simply the first row which differs from the sign row.

Figure 6:
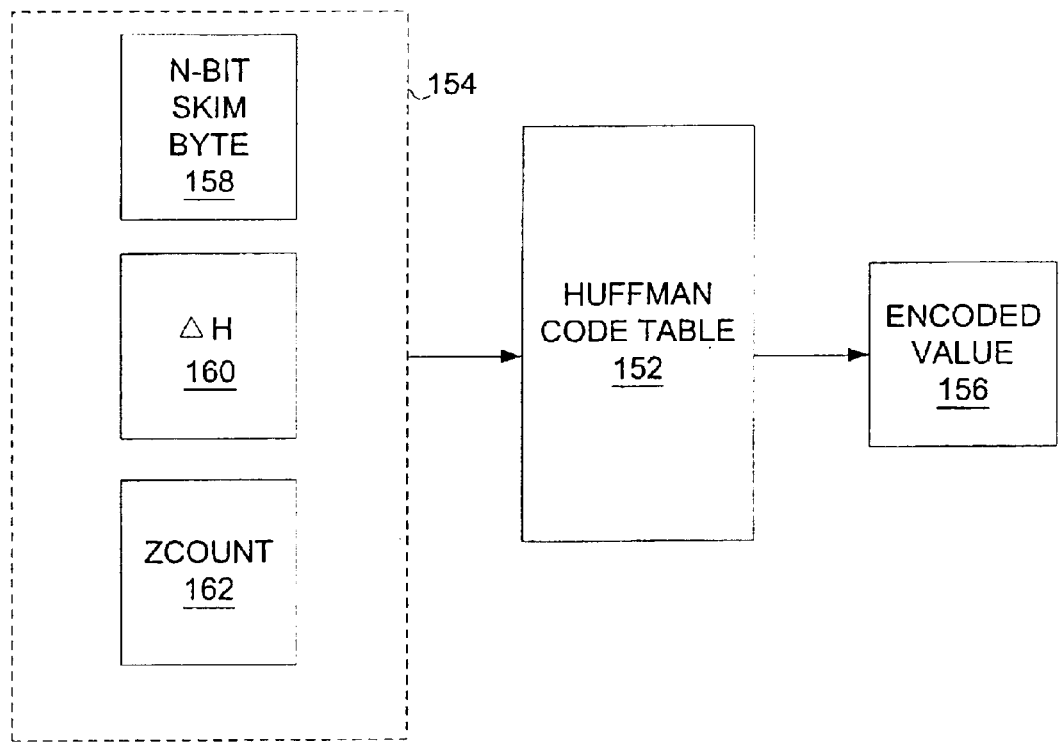
FIGS. 6 and 7 are block diagrams generally illustrating the use of a Huffman code table for encoding and decoding portions of image data respectively in accordance with the compression process of the present invention.

FIG. 6 is a block diagram generally illustrating the use of a Huffman code table 152 for encoding portions of image data in accordance with the compression process of the present invention. In practice, the Huffman code is determined from a two-dimensional array of Huffman code indexed by the ΔH and the skim row.

In accordance with conventional Huffman encoding, a unique Huffman code table is constructed for each file being compressed and is stored with the compressed file, the table being optimal for that file. However this has two disadvantages. First determining the optimal table is a CPU intensive process, and second saving it with the compressed file adds to the file size. In contrast, this invention uses a fixed Huffman code table that is constructed to be optimal for a small set of sample pictures. Since the statistical properties of the skim row and the ΔH values are similar for most images, the fixed Huffman code table is nearly optimal for most images. Furthermore the table does not need to be computed or stored with the images during the compression process. However note that a different set of sample images will result in a different Huffman code table.

In accordance with the present invention, a dictionary element 154 is determined by concatenating the N-bit skim byte (illustrated at 158) formed by the delta bits of the skim row 114 (FIG. 5) associated with a delta frame and a height difference value ΔH (illustrated at 160) associated with the delta frame. As an example, a dictionary element associated with ΔFRAME_0 (FIG. 5) is determined by concatenating the height difference value $\Delta H_0 = H_0 - H_1$ associated with ΔFRAME_0 and the N-bit skim byte formed by the delta bits of the skim row 114 (FIG. 5) associated with ΔFRAME_0. Alternatively, the dictionary element 154 may also be determined based on a ZCOUNT 162 that tracks the number of DELTA_WORDs associated with the delta frame that have all "0" bits, as explained further below. This dictionary element 154 is used to reference the Huffman code table 152 to determine an associated encoded value 156 which is stored at least temporarily to form a portion of compressed image data in accordance with the present invention.

Figure 7:
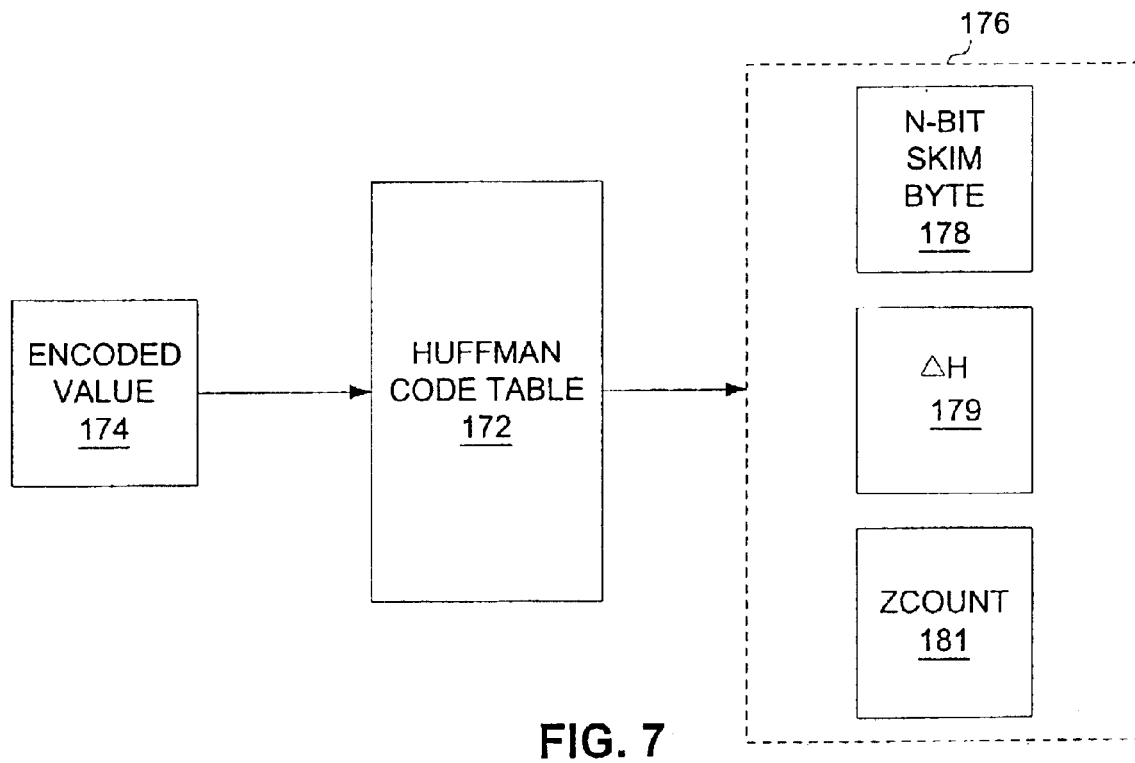

FIG. 7 is a block diagram generally illustrating the use of a Huffman code table for decoding portions of image data in accordance with the compression process of the present invention. An encoded value 174 associated with a corresponding one of the delta frames 104 (FIG. 5) is used to reference a Huffman code table 172 to determine an associated decoded value 176 which is stored at least temporarily to form a portion of decompressed image data in accordance with the present invention. The decoded value 176 includes concatenated bits of an N-bit skim byte (illustrated at 178) forming delta bits of the skim row 114 (FIG. 5) associated with the delta frame and a height difference value ΔH (illustrated at 179) associated with the delta frame. The decoded value 176 may also include a ZCOUNT 181 associated with the delta frame.

It may happen that many of the DELTA_WORDs are "0" (all bits are zero). This occurs for example in regions of the image that are one constant color. The fact that this occurs rather frequently can be taken advantage of by a special procedure that counts the number of zero DELTA_WORDs and encodes them with special entries in the Huffman code table.

More specifically, whenever a zero DELTA_WORD is encountered the algorithm starts counting the number of successive zero DELTA_WORDs. When the next non-zero DELTA_WORD is encountered or the end of the row block is encountered the counting terminates and the number of zero DELTA_WORDs is called ZCOUNT. ZCOUNT is then decomposed into the sum of multiples of powers of two (up to 512):

$$ZCOUNT = Z[0]*1 + Z[1]*2 + Z[2]*4 + Z[3]*8 + Z[4]*16 + Z[5]*32 + Z[6]*64 + Z[7]*128 + Z[8]*256 + Z[9]*512;$$

Then for each of the is that are non zero, Huffman codes are obtained that represent the corresponding power of two count of zero DELTA_WORDs. For example if ZCOUNT=

1723, and the Huffman codes corresponding to the powers of two are HZ0, HZ1, HZ2, HZ3, HZ4, HZ5, HZ6, HZ7, HZ8, HZ9:

$$1723=1*1+1*2+0*4+1*8+1*16=1*32+0*64+1*128+0*256+3*512$$

The resulting Huffman code string for encoding 1723 zero DELTA_WORDs is then expressed as,

HZ0, HZ1, HZ3, HZ4, HZ5, HZ7, HZ9, HZ9, HZ9

Another important note about the Huffman table is that the Huffman codes are limited to 12 bits. The usual implementation of a Huffman code allows for arbitrary size codes, with the large codes representing rare data occurrences. However the Huffman encoding and decoding process can be made much faster with a small loss in compression by limiting the codes to 12 bits. This is described below.

Figure 11:
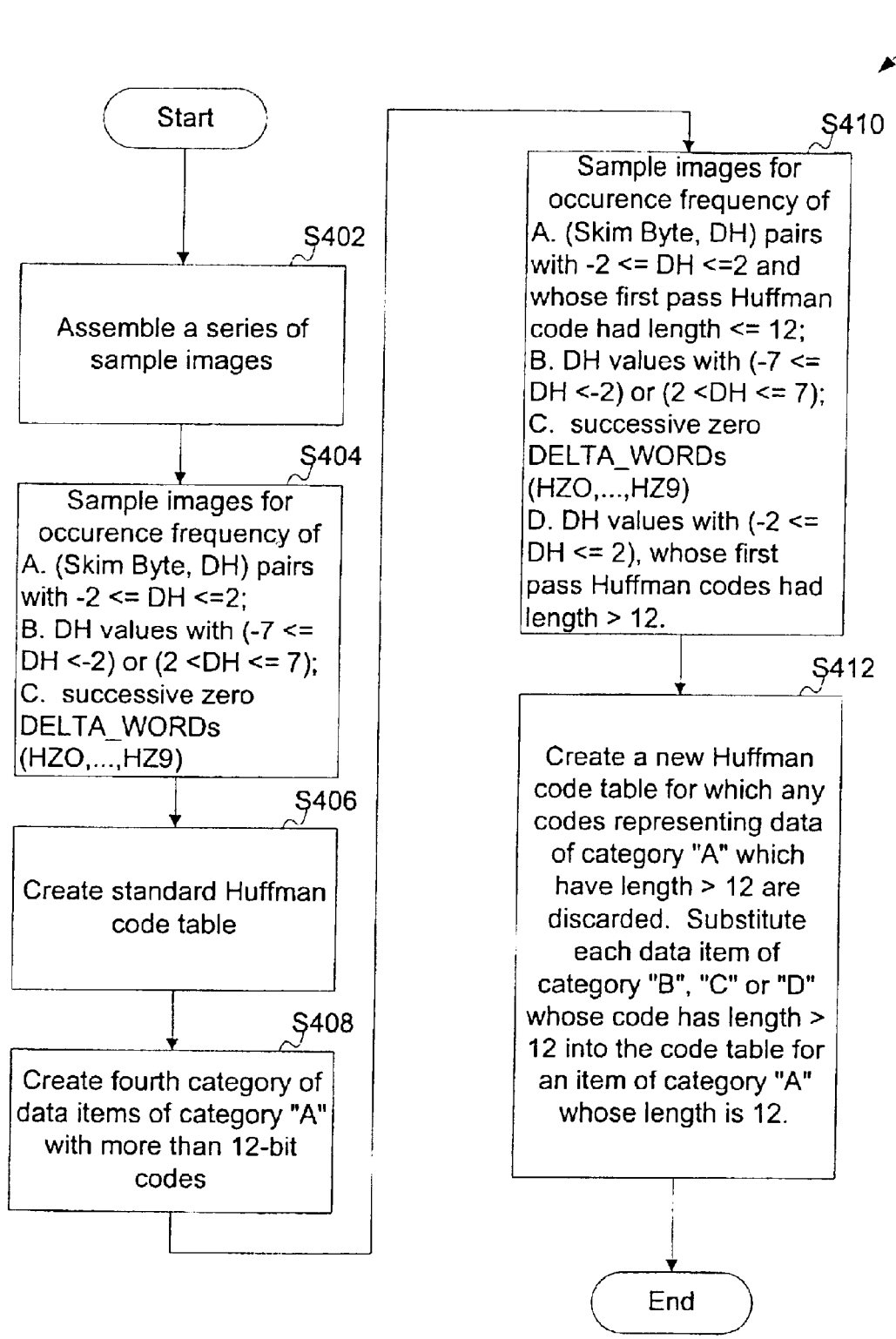
FIG. 11 is a flow diagram generally illustrating a Huffman code table creation process, according to embodiments of the present invention.

Huffman Code Table Creation:

As illustrated in FIG. 11, according to embodiments of the present invention, to create the Huffman code table, first, at S402 a series of sample images is assembled that represents a wide range of statistical distributions of pixel data that the algorithm will be called on to encode. Then creation of the 12-bit limited Huffman code table is provided by a two pass process.

During a first pass at S404, a poll is taken from these sample images of the frequencies of the occurrences of the following data item categories:

A. (Skim Byte, $\Delta H$) pairs with $-2 <= \Delta H <= 2$;
B. $\Delta H$ values with $(-7 <= \Delta H < -2)$ or $(2 < \Delta H <= 7)$; and
C. HZ0, . . . ,HZ9 resulting from the decomposition of counts of successive zero DELTA_WORDs as described above.

From this poll a standard Huffman code table is created at S406 with a well known algorithm. The resulting code table will have many codes with more than 12 bits, each corresponding to infrequent occurrences of the data item that it represents. At S408 all data items of category "A" with more than 12-bit codes are then put into a fourth category of data items for which a poll of frequencies of just their $\Delta H$ values is taken. Then, at S410, a second pass is performed. Thus, resulting data items that are polled in the second pass are:

A. (Skim Byte, $\Delta H$) pairs with $-2 <= \Delta H <= 2$ and whose first pass Huffman code had length <=12.
B. $\Delta H$ values with $(-7 <= \Delta H < -2)$ or $(2 < \Delta H <= 7)$;
C. HZ0, . . . ,HZ9 resulting from the decomposition of counts of successive zero DELTA_WORD's as described above; and
D. $\Delta H$ values with $(-2 <= \Delta H <= 2)$, whose first pass Huffman codes had length>12.

Then, at S412, a new Huffman code table is created for these data items. Any codes representing data of category "A" which have length >12 are discarded. Each data item of category "B", "C" or "D" whose code has length >12 is substituted into the code table for an item of category "A" whose length is 12. Thus all the items of category "B", "C" and "D", and the most frequent items of category "A" are represented in the new Huffman code table whose codes are limited to 12 bits.

Encoding:

According to embodiments of the present invention, encoding may proceed by way of three encoding arrays. A first array is for items of category "A"; a second array is for items of category "C"; and a third array is for items of category "B" or "D". The first or main array is for the category "A" items and will be called the "Encoding Look Up Table (ELUT)". It is a two dimensional array whose domain of indices is ELUT[−2:2][0:255]. The first index represents the $\Delta H$ and the second index the skim byte associated with the data item of category "A". For each index pair it returns either the Huffman code associated with that data item or "−1" if it corresponds to a data item of category "A" whose Huffman code was >12 bits and was therefore discarded from the Huffman code table. The array that maps data items of category "C" (HZ0. . . HZ9) to their corresponding Huffman codes is ZERO_LUT[0:9]. Finally, the array that maps data items of category "B" and "D" to their corresponding Huffman codes is SHIFT_LUT[−7:7].

During the skimming process, items of each category are encountered and processed sequentially by the appropriate array. The resulting Huffman codes are stored in a conceptually continuous bit stream. The codes are ordered in the bitstream from right to left—earlier codes are in the low order bit positions and later in higher order bit positions. This arrangement, along with 12-bit limited Huffman code table, allows for an efficient decoding of the data items. In practice the bit stream may be represented by a sequence of 64-bit or 32-bit words.

As an example, suppose the following are the data elements that result from the skimming process, according to embodiments of the present invention:

| Category | $\Delta H$ | SKIM BYTE(hex) | ZERO COUNT | Code (binary) | Code length |
|---|---|---|---|---|---|
| 1. B | −3 | — | — | 011011101 | 9 |
| 2. C | — | — | 64 | 001010001001 | 12 |
| 3. C | — | — | 2 | 10010101 | 8 |
| 4. A | −1 | 0x08 | — | 011001 | 6 |

Then these data elements are stored in the bit stream such that the code for data item 1 is in the lowest order bits, and the code for data item 2 is in the next lowest order bits, and so on, with the result:

011001 10010101 001010001001 011011101

Decoding:

According to embodiments of the present invention, the decoding look up table (DLUT) is defined to be an array of 4096 (=3D 2**12) elements. For each Huffman code all the indices in the DLUT whose low order bits match the Huffman code are mapped to data items associated with that code. Thus, for example, for the Huffman code associated with each of the above data items, the DLUT defines the following mapping.

DLUT[XXX011011101]→#1
DLUT[001010001001]→#2
DLUT[XXXX10010101]→#3
DLUT[XXXXXX011001]→#4 for all the entries of the DLUT where each can X be "0" and "1".

With the DLUT so defined, the decoding is simply a matter of masking the lowest 12 bits of the bitstream, looking up the result in the DLUT, and shifting the bitstream an amount equal to the looked up code's length.

Thus, according to the present example, the process becomes

Lowest 12 bits of bitstream→001011011101
DLUT[001011011101]→#1
bitstream shifted by 9 bits→ . . . 011001100101001010001001
Lowest 12 bits of bitstream→001010001001
DLUT[001010001001]→#2
bitstream shifted by 12 bits→ . . . 01100110010101
Lowest 12 bits of bitstream→100110010101
DLUT[100110010101]→#3
bitstream shifted by 8 bits→ . . . 011001
lowest 12 bits of bitstream→ . . . 011001
DLUT[ . . . 011001]→#4, and so on.

Figure 8:
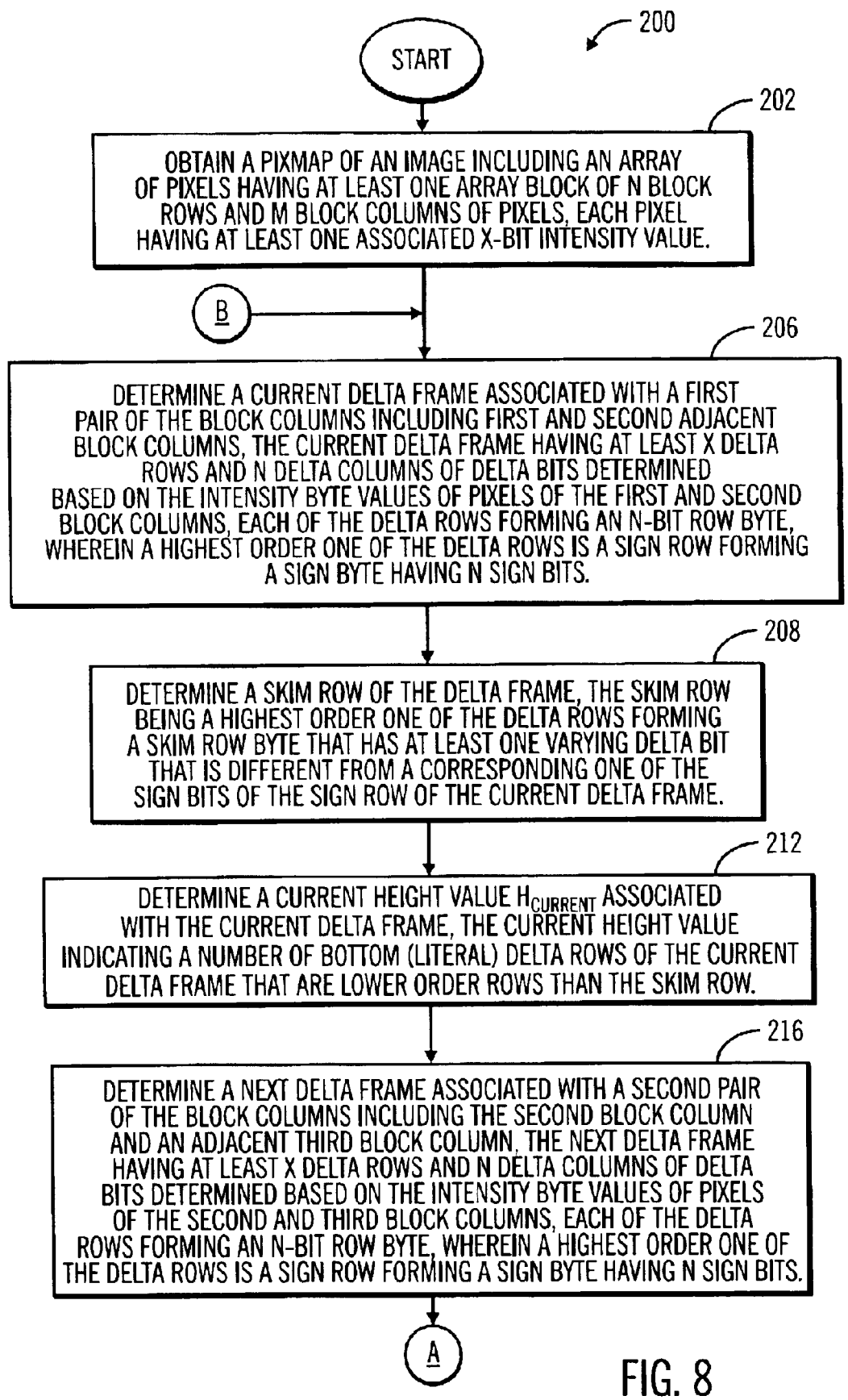
FIGS. 8 and 9 are flow diagrams generally illustrating the image data compression process of the present invention.

FIG. 8 shows a flow diagram generally illustrating the image data compression process of the present invention at 200. The process 200 is executed by a data compression system in accordance with the present invention which may be implemented as computer readable instructions stored in the system memory 18 and executed by a processor of the computer system 10 (FIG. 1). The compression process 200 may be used to compress one still image at a time, and may also be used to compress video images one frame at a time. The process 200 could also be used to compress audio data. Note that the compression process 200 is lossless.

As mentioned above, adjacent pairs of the delta frames 104 (FIG. 5) are processed together in accordance with the compression process of the present invention. Therefore, the process may be described in terms of processing steps performed on a current one of the delta frames 104 and processing steps performed on a next one of the delta frames 104 that is adjacent the current delta frame.

The process 200 begins with a step 202 in which the system obtains a pixel map 30 (FIG. 2) of an image including an array of pixels 32 (FIG. 2), the array including at least one array block 34 (FIG. 3) of N block rows 52 (FIG. 3) and M block columns 56 (FIG. 3) of pixels, each pixel having at least one associated X-bit intensity value. In one embodiment, each of the pixels 32 includes X=8 bits per color (RGB) which amounts to 24 bits per pixel. In another embodiment, each of the pixels 32 includes X=10 bits per color. Note that each RGB color is encoded separately in these embodiments. The process 200 may also be applied to 8-bit/pixel monochrome images.

From step 202, the process proceeds to step 206 in which the system generates a current delta frame 104 (FIG. 5) associated with a current pair of the block columns 56 (FIG. 5) including first and second adjacent block columns, the current delta frame having a predetermined plurality of delta rows 106 (FIG. 5) and N delta columns 108 of delta bits 102 determined based on the intensity byte values of the pixels 32 of the first and second block columns, wherein a highest order one of the delta rows is a sign row 112 (FIG. 5) forming a sign byte having N sign bits. Each of the delta rows 106 forms an N-bit delta row byte.

In the first embodiment, each delta column 108 (FIG. 5) forms a delta byte having a predetermined plurality of bits and is indicative of a difference between the intensity byte values of a corresponding adjacent pair of pixels 32 disposed in a corresponding one of the block rows 52 (FIG. 5) and in the first and second block columns 56. In this embodiment, each of the sign bits of the sign row 112 (FIG. 5) of the first delta frame is associated with a corresponding one of the adjacent pairs of pixels and indicates whether the difference between the intensity byte values of the corresponding adjacent pair of pixels is positive or negative.

In the faster encoding embodiment of the compression process, the step 206 of generating the current delta frame includes: determining a first word value by concatenating each of the X-bit intensity byte values of the pixels of the first block column; determining a second word value by concatenating each of the X-bit intensity byte values of the pixels of the second block column; determining a delta word value by subtracting the second word value from the first word value; and subdividing the delta word value into a plurality of N X-bit delta values each providing one of the delta bytes of the first delta frame.

From step 206, the process proceeds to step 208 in which, for the delta frame 104 (FIG. 5) associated with a current block column 56 of pixels 32, the system determines a skim row 114 that is the highest order one of the delta rows 106 less than the order of the sign row 112 and forming an N-bit skim row byte that has at least one varying delta bit 102 that is different from an associated one of the sign bits of the sign row 112 that is located in the same one of the delta columns 108 (FIG. 5). In one embodiment of the present invention, the skim row 114 (FIG. 5) is determined by performing XOR operations between each sign bit of the sign row 112 and each bit of the successively lower order delta rows 106 as described above.

From step 208, the process proceeds to step 212 in which for the current delta frame associated with the current block column, the system determines an associated height value $H_{CURRENT}$ indicating a number of literal rows 118 (FIG. 5) (i.e., all of the delta rows below the skim row 114, also referred to herein as the "bottom rows"). As described above, each of the delta rows 106 (FIG. 5) of an order between the skim row 114 and the sign row 112 has delta bit values identical to sign bit values of the sign row 112 and is designated as a "duplicate sign row" 116. The compression process of the present invention takes advantage of the redundancy of these duplicate sign rows. Note that the height value $H_{CURRENT}$ provides information indicative of the number of duplicate sign rows of the current delta frame which are identical to the sign row of the current frame. In the compression process of the present invention, the redundancy of the duplicate sign rows allows for approximately 15%–20% compression of the image data because the duplicate sign rows need not be encoded literally. Huffman encoding the duplicate sign rows provides for approximately 5% additional compression of the image data.

From step 212, the process proceeds to step 216 in which the system determines a next delta frame 104 (FIG. 5) associated with a second pair of the block columns 56 including the second block column and an adjacent third block column. The next delta frame 104 having the predetermined plurality of delta rows and N delta columns of associated delta bits. Each delta column forms a delta byte having the predetermined plurality of bits, and each delta row forms an N-bit row byte. A highest order one of the delta rows is a sign row 112 (FIG. 5) forming a sign byte having N sign bits. As for the current delta frame determined in step 206 as described above, the next delta frame may be determined in accordance with either of the two above described embodiments.

After executing step 216, the process proceeds to "A" (FIG. 9) to execute further steps of the compression process as further explained below.

Figure 9:
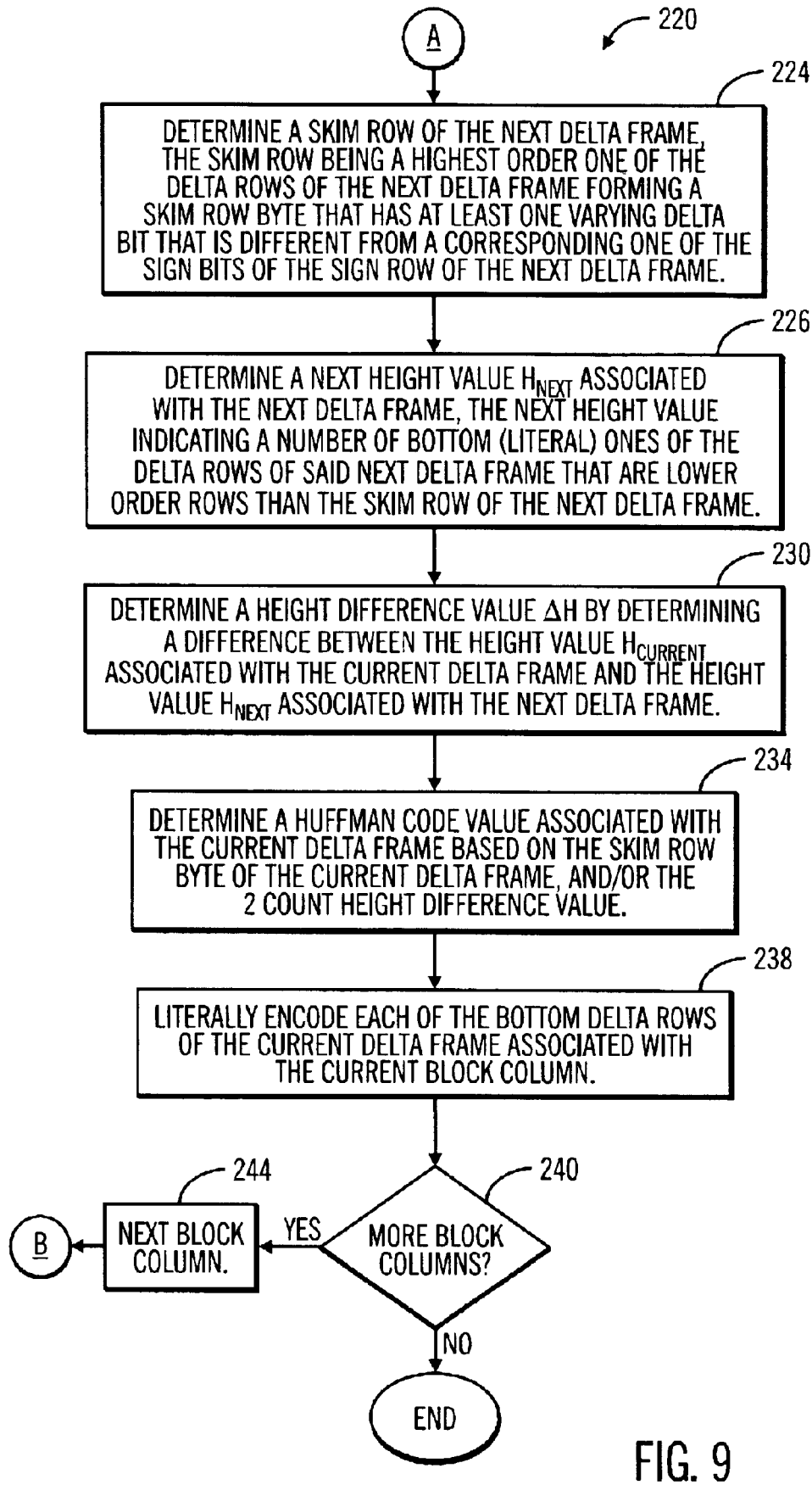

FIG. 9 shows a flow diagram generally illustrating further steps of the compression process 200 (FIG. 8). The depicted steps at 220 proceed from "A" (From FIG. 8) to step 224 in which the system determines an associated skim row 114 (FIG. 5) for the next delta frame. The skim row 114 (FIG. 5) is determined as the highest order one of the delta rows 106 less than the order of the sign row and forming an N-bit skim row byte that has at least one varying delta bit 102 that is different from an associated one of the sign bits of the sign row 112 that is located in the same one of the delta columns 108 of the next delta frame.

From step 224, the process proceeds to step 226 in which the system determines height value $H_{NEXT}$ for the next block delta frame. As explained above, height value $H_{NEXT}$ indicates a number of literal rows 118 (FIG. 5) including all of the delta rows 106 that are lower order rows than the skim row 114.

From step 226, the process proceeds to step 230 in which the system determines a height difference value ΔH associated with the current delta frame 104 (FIG. 5) by determining a difference between the height value $H_{CURRENT}$ associated with the current delta frame and the height value $H_{NEXT}$ associated with the next delta frame.

From step 230, the process proceeds to step 232 in which the system determines a ZCOUNT for the DELTA_WORDS, as discussed above The process then proceeds to step 234 in which the system determines a Huffman code value by referring to the Huffman code table 152 (FIG. 6). In one embodiment, step 234 includes: determining a dictionary element 154 by concatenating the N-bit skim byte 158 formed by the delta bits of the skim row 114 (FIG. 5) associated with the current delta frame (as determined in step 208 of FIG. 8) and the height difference value ΔH 160 associated with the current delta frame (as determined in step 230); and using the dictionary element 154 to reference the Huffman code table 152 (FIG. 6) to determine an associated encoded value 156. The dictionary element 154 may also be determined based on a ZCOUNT 162, as explained above. The encoded value 156 may be stored at least temporarily to form a portion of compressed image data in accordance with the present invention. As discussed above, FIG. 11 shows a flow diagram generally illustrating a Huffman code table creation process at 400, according to one embodiment of the present invention.

At step 238 the system literally encodes each of the literal rows 118 (FIG. 5) of the current delta frame associated with the current block column.

From step 238, the process proceeds to step 240 at which it is determined whether there are more block columns to be processed, and if so, the process proceeds to step 244 in which the system advances to a next block column, after which the process proceeds to open "B" (back to step 206 of FIG. 8). Alternatively, if there are no more block columns to be processed, the process ends. Note that a decoding process, for decompressing skim encoded image data files generated in accordance with the process 200, is implemented in accordance with steps which are simply the reverse of the above described steps of the compression process 200 described above.

Informal performance tests suggest that the above described compression process provides approximately 25–45% better compression than RLA encoding (as in Wavefront raster image files), and LZW encoding used for GIF files. Speed of compression may be approximately 20% slower than RLA compression and approximately 2–3 times faster than LZW compression. Speed of decompression is competitive with RLA decompression and probably 20% faster than LZW compression. Because skim encoded files, generated in accordance with the above described compression process of the present invention, are smaller and typically moved in larger portions, the skim encoded files stress storage space and networks less, and therefore may be significantly faster than RLA or GIF files in times of peak network/disk usage.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A process of compressing a two dimensional array of data in the form of a pixel map including an array of pixels having at least one array block having a plurality of block rows and a plurality of block columns of the pixels, each pixel having at least one associated intensity value, the process comprising:

generating a delta frame associated with a pair of the block columns, said delta frame having a plurality of delta rows and delta columns of delta bits, one of said delta rows being a highest order row;

determining a number of duplicate ones of said delta rows, each of said duplicate rows forming an identical row byte value having delta bits which have a predetermined relationship with the delta bits of said highest order row;

recording information indicative of said number of duplicate rows; and developing compressed data including said information indicative of said number of duplicate rows of said delta frame.

2. A process as recited in claim 1 wherein determining a number of duplicate rows includes determining a skim one of said delta rows of said delta frame, said skim row being a highest order one of said delta rows less than the order of said highest order row and forming a skim row byte having at least one delta bit that is different from a corresponding one of said delta bits of said highest order row, each of said duplicate rows being of an order which is lower than the order of said highest order row and higher than the order of said skim row.

3. A process as recited in claim 1 wherein said highest order delta row is a sign row forming a sign byte having a plurality of sign bits each being associated with a corresponding one of adjacent pairs of pixels and indicating whether a difference between the intensity values of said corresponding adjacent pair of pixels is positive or negative, and wherein each of the delta bits of each said duplicate row is equal to an associated one of said sign bits.

4. A process as recited in claim 3 wherein determining a number of duplicate rows includes determining a skim one of said delta rows of said delta frame, said skim row being a highest order one of said delta rows less than the order of said sign row and forming a skim row byte having at least one delta bit that is different from a corresponding one of said sign bits of said sign row, each of said duplicate rows being of an order which is lower than the order of said sign row and higher than the order of said skim row.

5. A process as recited in claim 4 wherein recording information indicative of said number of duplicate rows includes determining and recording information indicative of a height value indicating a number of delta rows of said delta frame that are lower order rows than said skim row.

6. A process as recited in claim 5 wherein said delta frame is a first delta frame associated with a first pair of the block columns and wherein said height value is a first height value, the process further comprising:

generating a second delta frame associated with a second pair of the block columns, said delta frame having a plurality of delta rows and delta columns of delta bits, each said delta column forming a delta byte indicating a difference between the intensity values of a corresponding adjacent pair of pixels disposed in said second pair of block columns, one of said delta rows being a highest order row of said second delta frame;

determining a skim row of said second delta frame, said skim row being a highest order one of said delta rows less than the order of said sign row of said second delta frame and forming a skim row byte having at least one delta bit that is different from a corresponding one of said sign bits of said sign row of said second delta frame; and determining a second height value indicating a number of delta rows of said second delta frame that are lower order rows than said skim row;

wherein recording information indicative of said number of duplicate rows of said first delta frame further includes, determining a height difference value between said first and second height values, determining a Huffman code value associated with said first delta frame based on at least one of said height difference value and said skim row byte of said first delta frame, and recording said Huffman code value.

7. A process as recited in claim 1 wherein each said delta byte formed by an associated delta column is determined by determining a difference between the intensity values of a corresponding adjacent pair of pixels disposed in said pair of the block columns.

8. A process as recited in claim 1 wherein said pair of the block columns includes a first block column and a second block column of pixels, and wherein generating a delta frame comprises:

determining a first word value by concatenating each of said intensity values of the pixels of said first block column;

determining a second word value by concatenating each of the intensity values of the pixels of said second block column;

determining a delta word value by subtracting the second word value from the first word value; and subdividing the delta word value into a plurality of X-bit delta values each providing an associated one of a plurality of delta bytes of the delta frame.

9. A process of compressing a two dimensional array of data in the form of a pixel map including an array of pixels having at least one array block having a plurality of N block rows and a plurality of M block columns of the pixels, each pixel having at least one associated X-bit intensity value, the process comprising:

(a) generating a first delta frame associated with a first pair of the block columns including first and second adjacent block columns, said first delta frame having a predetermined plurality of delta rows and N delta columns of delta bits, each said delta column forming a delta byte having said predetermined plurality of bits, each said delta row forming an N-bit row byte, wherein a highest order one of said delta rows is a sign row forming a sign byte having N sign bits;

(b) determining a skim row of said first delta frame, said skim row being a highest order one of said delta rows less than the order of said sign row and forming a skim row byte having at least one delta bit that is different from a corresponding one of said sign bits of said sign row;

(c) determining a first height value associated with said first delta frame, said first height value indicating a number of said delta rows of said first delta frame that are lower order rows than said skim row;

(d) generating a second delta frame associated with a second pair of the block columns including said second block column and an adjacent third block column, said second delta frame having said predetermined plurality of delta rows and N delta columns of associated delta bits, each said delta column forming a delta byte having said predetermined plurality of bits, each said delta row forming an N-bit row byte, wherein a highest order one of said delta rows is a sign row forming a sign byte having N sign bits;

(e) determining a skim row of said second delta frame, said skim row being a highest order one of said delta rows of said second delta frame less than the order of said sign row and forming a skim row byte having at least one delta bit that is different from a corresponding one of said sign bits of said sign row of said second delta frame;

(f) determining a second height value associated with said second delta frame, said second height value indicating a number of delta rows of said second delta frame that are lower order rows than said skim row;

(g) determining a height difference value between said first and second height values;

(h) determining a Huffman code value associated with said first delta frame based on at least one of said height difference value and said skim row byte of said first delta frame; and (i) performing steps corresponding to steps (d) through (h) for each subsequent one of the block columns to develop compressed data including said Huffman code values.

10. A process as recited in claim 9 wherein:

said step (a) of generating a first delta frame includes determining each said delta byte formed by a delta column of said first delta frame by determining a difference between the intensity values of a corresponding adjacent pair of pixels disposed in a corresponding one of the block rows and in said first and second block columns, each of said sign bits of said sign row of said first delta frame being associated with a corresponding one of said adjacent pairs of pixels and indicating whether the difference between the intensity values of said corresponding adjacent pair of pixels is positive or negative; and said step (d) of generating a second delta frame includes determining each said delta byte formed by a delta column of said second delta frame by determining a difference between the intensity values of a corresponding adjacent pair of pixels disposed in a corresponding one of the block rows and in said second and third block columns, each of said sign bits of said sign row of said second delta frame being associated with a corresponding one of said adjacent pairs of pixels and indicating whether the difference between the intensity values of said corresponding adjacent pair of pixels is positive or negative.

11. A process as recited in claim 9 wherein said step (a) of generating a first delta frame comprises:

determining a first word value by concatenating each of said X-bit intensity values of the pixels of said first block column;

determining a second word value by concatenating each of the X-bit intensity values of the pixels of said second block column;

determining a delta word value by subtracting the second word value from the first word value; and subdividing the delta word value into a plurality of N X-bit delta values each providing one of a plurality of delta bytes of the first delta frame.

12. A process as recited in claim 9 wherein:

said step (a) of generating a first delta frame includes,
determining a first word value by concatenating each of said X-bit intensity values of said pixels of said first block column,
determining a second word value by concatenating each of said X-bit intensity values of said pixels of said second block column,
determining a delta word value by subtracting said second word value from said first word value, and
subdividing said delta word value into a plurality of N X-bit delta values each providing one of a plurality of delta bytes of said first delta frame; and said step (d) of generating a second delta frame includes,
determining a third word value by concatenating each of said X-bit intensity values of said pixels of said third block column,
determining a delta word value by subtracting said third word value from said second word value, and
subdividing said delta word value into a plurality of N X-bit delta values each providing one of a plurality of delta bytes of said second delta frame.

13. A process as recited in claim 9 wherein said step (h) of determining a Huffman code value further comprises:

determining a dictionary element based on at least one of said skim row byte of said first delta frame, said height difference value and a number of zero delta word values; and using said dictionary element to reference a Huffman code table to determine said Huffman code value associated with said first delta frame.

14. A process as recited in claim 13 wherein:

said step (c) of determining a first height value associated with said first delta frame includes recording delta bit values of said delta rows of said first delta frame that are lower order rows than said skim row of said first delta frame; and said step (f) of determining a second height value associated with said second delta frame includes recording delta bit values of said delta rows of said second delta frame that are lower order rows than said skim row of said second delta frame;

said recorded delta bits being literally encoded within said compressed data.

15. A process as recited in claim 9 wherein said step (b) of determining a skim row of said first delta frame includes,
determining a number of duplicate rows of said first delta frame, each skim row being a higher order row than said skim row and a lower order row than said sign row of said first delta frame, and
recording information indicative of said number of duplicate rows of said first delta frame; and
said step (e) of determining a skim row of said second delta frame includes,
determining a number of duplicate rows of said second delta frame, each duplicate row being a higher order row than said skim row and a lower order row than said sign row of said second delta frame, and
recording information indicative of said number of duplicate rows of said second delta frame.

16. A process as recited in claim 9 wherein said predetermined plurality of delta rows includes at least X delta rows.

17. A process of compressing a two dimensional array of data in the form of a pixel map including an array of pixels having at least one array block having a plurality of N block rows and a plurality of M block columns of the pixels, each pixel having at least one associated X-bit intensity value, the process comprising:

(a) generating a first delta frame associated with a first pair of the block columns including first and second adjacent block columns, said first delta frame having a predetermined plurality of delta rows and N delta columns of delta bits, each said delta column forming a delta byte having said predetermined plurality of bits and being indicative of a difference between the intensity values of a corresponding adjacent pair of pixels disposed in a corresponding one of the block rows and in said first and second block columns, each said delta row forming an N-bit row byte, wherein a highest order one of said delta rows is a sign row forming a sign byte having N sign bits each being associated with a corresponding one of said adjacent pairs of pixels and indicating whether the difference between the intensity values of said corresponding adjacent pair of pixels is positive or negative;

(b) determining a skim row of said first delta frame, said skim row being a highest order one of said delta rows less than the order of said sign row which forms a skim row byte having at least one delta bit that is different from a corresponding one of said sign bits of said sign row;

(c) determining a first height value associated with said first delta frame, said first height value indicating a number of said delta rows of said first delta frame that are lower order rows than said skim row;

(d) generating a second delta frame associated with a second pair of the block columns including said second block column and an adjacent third block column, said second delta frame having said predetermined plurality of delta rows and N delta columns of associated delta bits, each said delta column forming a delta byte having said predetermined plurality of bits and being determined based at least in part on a difference between the intensity values of a corresponding adjacent pair of pixels disposed in a corresponding one of the block rows and in said second and third block columns, each said delta row forming an N-bit row byte, wherein a highest order one of said delta rows is a sign row forming a sign byte having N sign bits each being associated with a corresponding one of said adjacent pairs of pixels and indicating whether the difference between the intensity values of said corresponding adjacent pair of pixels is positive or negative;

(e) determining a skim row of said second delta frame, said skim row being a highest order one of said delta rows of said second delta frame less than the order of said sign row which forms a skim row byte having at least one delta bit that is different from a corresponding one of said sign bits of said sign row of said second delta frame;

(f) determining a second height value associated with said second delta frame, said second height value indicating a number of delta rows of said second delta frame that are lower order rows than said skim row;

(g) determining a height difference value between said first and second height values;

(h) determining a Huffman code value associated with said first delta frame based on at least one of said height difference value and said skim row byte of said first delta frame; and (i) performing steps corresponding to steps (d) through (h) for each subsequent one of the block columns to develop compressed data including said Huffman code values.

18. A process as recited in claim 17 wherein said step (h) of determining a Huffman code value further comprises:

determining a dictionary element by concatenating said skim row byte of said first delta frame and said height difference value; and using said dictionary element to reference a Huffman code table to determine said Huffman code value associated with said first delta frame.

19. A process as recited in claim 18 wherein:

said step (c) of determining a first height value associated with said first delta frame includes recording the delta bit values of said delta rows of said first delta frame that are lower order rows than said skim row of said first delta frame; and said step (f) of determining a second height value associated with said second delta frame includes recording the delta bit values of said delta rows of said second delta frame that are lower order rows than said skim row of said second delta frame;

said recorded delta bits being literally encoded within said compressed data.

20. A process as recited in claim 17 wherein said step (b) of determining a skim row of said first delta frame includes, determining a number of duplicate rows of said first delta frame, each duplicate row being a higher order row than said skim row and a lower order row than said sign row of said first delta frame, and recording information indicative of said number of duplicate rows of said first delta frame; and said step (e) of determining a skim row of said second delta frame includes, determining a number of duplicate rows of said second delta frame, each duplicate row being a higher order row than said skim row and a lower order row than said sign row of said second delta frame, and recording information indicative of said number of duplicate rows of said second delta frame.

21. A process as recited in claim 17 wherein said predetermined plurality of delta rows includes at least X delta rows.

22. A process as recited in claim 17 wherein said step (a) of generating a first delta frame comprises:

determining a first word value by concatenating each of said X-bit intensity values of the pixels of said first block column;

determining a second word value by concatenating each of the X-bit intensity values of the pixels of said second block column;

determining a delta word value by subtracting the second word value from the first word value; and subdividing the delta word value into a plurality of N X-bit delta values each providing one of a plurality of delta bytes of said first delta frame.

23. A machine readable storage device having stored therein encoding instructions for executing a process of compressing a two dimensional array of data in the form of a pixel map including an array of pixels having at least one array block having a plurality of block rows and a plurality of block columns of the pixels, each pixel having at least one associated intensity value, comprising:

generating a delta frame associated with a pair of the block columns, said delta frame having a plurality of delta rows and delta columns of delta bits, one of said delta rows being a highest order row;

determining a number of duplicate ones of said delta rows, each of said duplicate rows forming an identical row byte value having delta bits which have a predetermined relationship with the delta bits of said highest order row;

recording information indicative of said number of duplicate rows; and developing compressed data including said information indicative of said number of duplicate rows of said delta frame.

24. A machine readable storage device as recited in claim 23 wherein determining a number of duplicate rows includes determining a skim one of said delta rows of said delta frame, said skim row being a highest order one of said delta rows less than the order of said highest order row and forming a skim row byte having at least one delta bit that is different from a corresponding one of said delta bits of said highest order row, each of said duplicate rows being of an order which is lower than the order of said highest order row and higher than the order of said skim row.

25. A machine readable storage device as recited in claim 23 wherein said highest order delta row is a sign row forming a sign byte having a plurality of sign bits each being associated with a corresponding one of said adjacent pairs of pixels and indicating whether the difference between the intensity values of said corresponding adjacent pair of pixels is positive or negative, and wherein each of the delta bits of each said duplicate row is equal to an associated one of said sign bits.

26. A machine readable storage device as recited in claim 25 wherein determining a number of duplicate rows includes determining a skim one of said delta rows of said delta frame, said skim row being a highest order one of said delta rows less than the order of said sign row and forming a skim row byte having at least one delta bit that is different from a corresponding one of said sign bits of said sign row, each of said duplicate rows being of an order which is lower than the order of said sign row and higher than the order of said skim row.

27. A machine readable storage device as recited in claim 26 wherein recording information indicative of said number of duplicate rows includes determining and recording information indicative of a height value indicating a number of delta rows of said delta frame that are lower order rows than said skim row.

28. A machine readable storage device as recited in claim 27 wherein said delta frame is a first delta frame associated with a first pair of the block columns and wherein said height value is a first height value, the process further comprising:

generating a second delta frame associated with a second pair of the block columns, said delta frame having a plurality of delta rows and delta columns of delta bits, each said delta column forming a delta byte indicating a difference between the intensity values of a corresponding adjacent pair of pixels disposed in said second pair of block columns, one of said delta rows being a highest order row of said second delta frame;

determining a skim row of said second delta frame, said skim row being a highest order one of said delta rows less than the order of said sign row of said second delta frame and forming a skim row byte having at least one delta bit that is different from a corresponding one of said sign bits of said sign row of said second delta frame; and determining a second height value indicating a number of delta rows of said second delta frame that are lower order rows than said skim row;

wherein recording information indicative of said number of duplicate rows of said first delta frame further includes, determining a height difference value between said first and second height values, determining a Huffman code value associated with said first delta frame based on at least one of said height difference value and said skim row byte of said first delta frame, and recording said Huffman code value.

29. A machine readable storage device as recited in claim 28 wherein each said delta byte formed by an associated delta column is determined by determining a difference between the intensity values of a corresponding adjacent pair of pixels disposed in said pair of block columns.

30. A machine readable storage device as recited in claim 23 wherein said pair of the block columns includes a first block column and a second block column of pixels, and wherein generating a delta frame comprises:

determining a first word value by concatenating each of said intensity values of the pixels of said first block column;

determining a second word value by concatenating each of the intensity values of the pixels of said second block column;

determining a delta word value by subtracting the second word value from the first word value; and subdividing the delta word value into a plurality of X-bit delta values each providing an associated one of a plurality of delta bytes of said delta frame.

31. A system for compressing a two dimensional array of data in the form of a pixel map including an array of pixels having at least one array block having a plurality of block rows and a plurality of block columns of the pixels, each pixel having at least one associated intensity value, comprising:

means for generating a delta frame associated with a pair of the block columns, said delta frame having a plurality of delta rows and delta columns of delta bits, one of said delta rows being a highest order row;

means for determining a number of duplicate ones of said delta rows, each of said duplicate rows forming an identical row byte value having delta bits which have a predetermined relationship with the delta bits of said highest order row;

means for recording information indicative of said number of duplicate rows; and means for developing compressed data including said information indicative of said number of duplicate rows of said delta frame.

32. A system as recited in claim 31 wherein said means for determining a number of duplicate rows includes means for determining a skim one of said delta rows of said delta frame, said skim row being a highest order one of said delta rows less than the order of said highest order row and forming a skim row byte having at least one delta bit that is different from a corresponding one of said delta bits of said highest order row, each of said duplicate rows being of an order which is lower than the order of said highest order row and higher than the order of said skim row.

33. A system as recited in claim 31 wherein said highest order delta row is a sign row forming a sign byte having a plurality of sign bits each being associated with a corresponding one of said adjacent pairs of pixels and indicating whether the difference between the intensity values of said corresponding adjacent pair of pixels is positive or negative, and wherein each of the delta bits of each said duplicate row is equal to an associated one of said sign bits.

34. A system as recited in claim 33 wherein said means for determining a number of duplicate rows includes means for determining a skim one of said delta rows of said delta frame, said skim row being a highest order one of said delta rows less than the order of said sign row and forming a skim row byte having at least one delta bit that is different from a corresponding one of said sign bits of said sign row, each of said duplicate rows being of an order which is lower than the order of said sign row and higher than the order of said skim row.

35. A system as recited in claim 34 wherein said means for recording information indicative of said number of duplicate rows includes determining and recording information indicative of a height value indicating a number of delta rows of said delta frame that are lower order rows than said skim row.

36. A system as recited in claim 35 wherein said delta frame is a first delta frame associated with a first pair of the block columns and wherein said height value is a first height value, the system further comprising:

means for generating a second delta frame associated with a second pair of the block columns, said second delta frame having a plurality of delta rows and delta columns of delta bits, each said delta column forming a delta byte indicating a difference between the intensity values of a corresponding adjacent pair of pixels disposed in said second pair of block columns, one of said delta rows being a highest order row of said second delta frame;

means for determining a skim row of said second delta frame, said skim row being a highest order one of said delta rows less than the order of said sign row of said second delta frame and forming a skim row byte having at least one delta bit that is different from a corresponding one of said sign bits of said sign row of said second delta frame; and means for determining a second height value indicating a number of delta rows of said second delta frame that are lower order rows than said skim row;

wherein said means for recording information indicative of said number of duplicate rows of said first delta frame further includes, means for determining a height difference value between said first and second height values, means for determining a Huffman code value associated with said first delta frame based on at least one of said height difference value and said skim row byte of said first delta frame, and means for recording said Huffman code value.

37. A system as recited in claim 36 wherein each said delta byte formed by an associated delta column is determined by determining a difference between the intensity values of a corresponding adjacent pair of pixels disposed in said pair of block columns.

38. A system as recited in claim 31 wherein said pair of block columns includes a first block column and a second block column of pixels, and wherein said means for generating a delta frame comprises:

means for determining a first word value by concatenating each of said intensity values of the pixels of said first block column;

means for determining a second word value by concatenating each of the intensity values of the pixels of said second block column;

means for determining a delta word value by subtracting the second word value from the first word value; and means for subdividing the delta word value into a plurality of X-bit delta values each providing an associated one of a plurality of delta bytes of said delta frame.

* * * * *